(12) United States Patent
Tsurume

(10) Patent No.: US 8,749,063 B2
(45) Date of Patent: Jun. 10, 2014

(54) SEMICONDUCTOR DEVICE AND METHOD FOR MANUFACTURING THE SAME

(75) Inventor: Takuya Tsurume, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 696 days.

(21) Appl. No.: 11/793,199

(22) PCT Filed: Jan. 18, 2006

(86) PCT No.: PCT/JP2006/301087
§ 371 (c)(1),
(2), (4) Date: Jun. 18, 2007

(87) PCT Pub. No.: WO2006/080322
PCT Pub. Date: Aug. 3, 2006

(65) Prior Publication Data
US 2007/0262403 A1 Nov. 15, 2007

(30) Foreign Application Priority Data
Jan. 28, 2005 (JP) .................................. 2005-022191

(51) Int. Cl.
H01L 23/48 (2006.01)
H01L 23/52 (2006.01)
H01L 29/40 (2006.01)
H01L 21/4763 (2006.01)

(52) U.S. Cl.
USPC .......................................... 257/758; 438/618

(58) Field of Classification Search
USPC ............ 257/758, E21.645, E27.111; 438/618
See application file for complete search history.

(56) References Cited

U.S. PATENT DOCUMENTS 5,834,840 A * 11/1998 Robbins et al. ................ 257/705
6,209,480 B1 * 4/2001 Moslehi ........................ 118/723 I
(Continued)

FOREIGN PATENT DOCUMENTS

CN 1440036 9/2003
CN 1525393 9/2004
(Continued)

OTHER PUBLICATIONS

Office Action (Application No. 200680003335.2) dated Jul. 10, 2009.

(Continued)

*Primary Examiner* — Matthew Landau
*Assistant Examiner* — Igwe U Anya
(74) *Attorney, Agent, or Firm* — Eric J. Robinson; Robinson Intellectual Property Law Office, P.C.

(57) ABSTRACT

An object of the prevent invention is to provide a semiconductor device having a conductive film, which sufficiently serves as an antenna, and a method for manufacturing thereof. The semiconductor device has an element formation layer including a transistor, which is provided over a substrate, an insulating film provided on the element formation layer, and a conductive film serving as an antenna, which is provided on the insulating film. The insulating film has a groove. The conductive film is provided along the surface of the insulating film and the groove. The groove of the insulating film may be provided to pass through the insulating film. Alternatively, a concave portion may be provided in the insulating film so as not to pass through the insulating film. A structure of the groove is not particularly limited, and for example, the groove can be provided to have a tapered shape, etc.

22 Claims, 18 Drawing Sheets

(56) References Cited

U.S. PATENT DOCUMENTS

| | | |
|---|---|---|
| 6,452,249 B1 | 9/2002 | Maeda et al. |
| 6,509,217 B1* | 1/2003 | Reddy ............... 438/153 |
| 6,611,041 B2 | 8/2003 | Maeda et al. |
| 6,795,339 B2 | 9/2004 | Ooishi |
| 6,940,408 B2 | 9/2005 | Ferguson et al. |
| 7,224,280 B2 | 5/2007 | Ferguson et al. |
| 7,236,081 B2 | 6/2007 | Jeong et al. |
| 7,405,643 B2 | 7/2008 | Jeong et al. |
| 7,518,692 B2 | 4/2009 | Yamazaki et al. |
| 7,973,313 B2 | 7/2011 | Arai et al. |
| 8,193,532 B2 | 6/2012 | Arai et al. |
| 2003/0024635 A1 | 2/2003 | Utsunomiya |
| 2003/0149505 A1* | 8/2003 | Mogensen ............... 700/117 |
| 2003/0174099 A1* | 9/2003 | Bauer et al. ............... 343/893 |
| 2004/0152276 A1 | 8/2004 | Nishimura |
| 2004/0164302 A1 | 8/2004 | Arai et al. |
| 2004/0175515 A1 | 9/2004 | Lawrence et al. |
| 2005/0059202 A1* | 3/2005 | Kimura ............... 438/222 |
| 2005/0134463 A1* | 6/2005 | Yamazaki ............... 340/572.8 |
| 2005/0148121 A1* | 7/2005 | Yamazaki et al. ............... 438/149 |
| 2005/0168235 A1* | 8/2005 | Arai et al. ............... 324/765 |
| 2005/0250308 A1* | 11/2005 | Yamaguchi et al. ............... 438/618 |
| 2005/0270752 A1* | 12/2005 | Credelle et al. ............... 361/736 |
| 2006/0113894 A1* | 6/2006 | Fujii et al. ............... 313/499 |
| 2006/0115983 A1* | 6/2006 | Fujii et al. ............... 438/640 |
| 2006/0157798 A1* | 7/2006 | Hayashi et al. ............... 257/374 |
| 2006/0164249 A1* | 7/2006 | Lutz et al. ............... 340/572.7 |
| 2007/0023758 A1* | 2/2007 | Tsurume et al. ............... 257/66 |
| 2007/0085202 A1* | 4/2007 | Shionoiri ............... 257/734 |
| 2007/0148981 A1* | 6/2007 | Rogge ............... 438/700 |
| 2007/0164413 A1* | 7/2007 | Arai et al. ............... 257/679 |
| 2007/0216534 A1 | 9/2007 | Ferguson et al. |
| 2011/0223966 A1 | 9/2011 | Arai et al. |

FOREIGN PATENT DOCUMENTS

| | | |
|---|---|---|
| EP | 1437683 A | 7/2004 |
| EP | 1453088 A | 9/2004 |
| JP | 59-008354 | 1/1984 |
| JP | 01-272135 A | 10/1989 |
| JP | 04-343228 A | 11/1992 |
| JP | 05-175198 A | 7/1993 |
| JP | 2000-133520 A | 5/2000 |
| JP | 2003-243631 A | 8/2003 |
| JP | 2004-220591 A | 8/2004 |
| JP | 2004-221284 A | 8/2004 |
| JP | 2004-282050 A | 10/2004 |
| JP | 2004-317544 | 11/2004 |
| JP | 2004-355337 A | 12/2004 |
| JP | 2006-191050 A | 7/2006 |
| WO | WO-2004/061753 | 7/2004 |
| WO | WO-2006/009934 | 1/2006 |

OTHER PUBLICATIONS

International Search Report (Application No. PCT/JP2006/301087) dated Apr. 25, 2006.

Written Opinion (Application No. PCT/JP2006/301087) dated Apr. 25, 2006.

Chinese Office Action (Application No. 201010201360.X) Dated May 11, 2011.

Chinese Office Action (Application No. 201010201360.X) Dated Jul. 11, 2012.

* cited by examiner 310  315  311

312

316  313

314

317

320  321  322  323

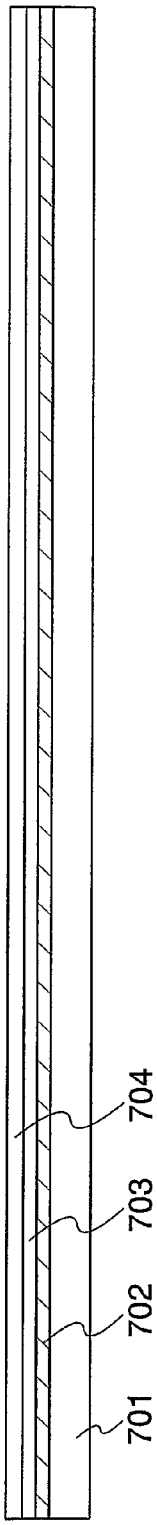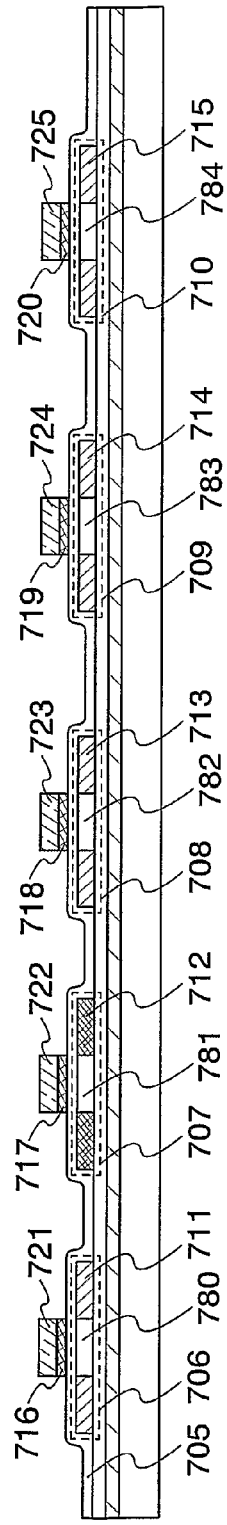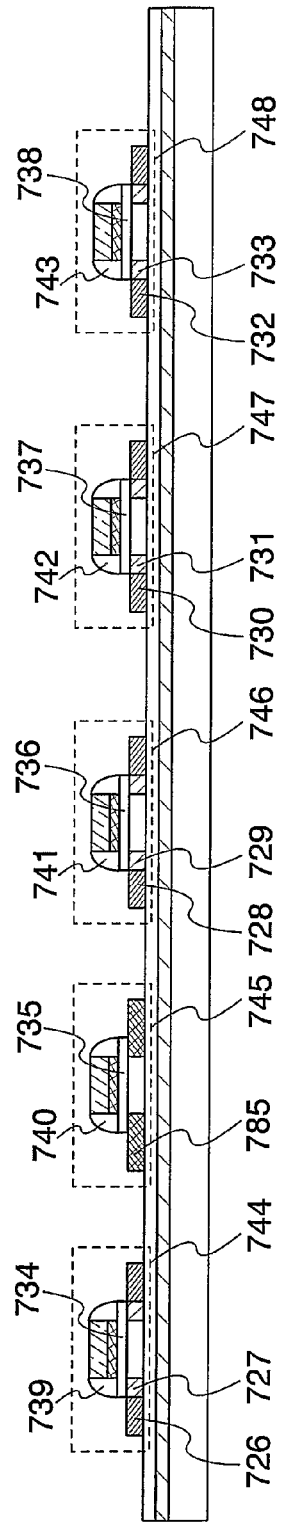
FIG. 11A
FIG. 11B
FIG. 11C

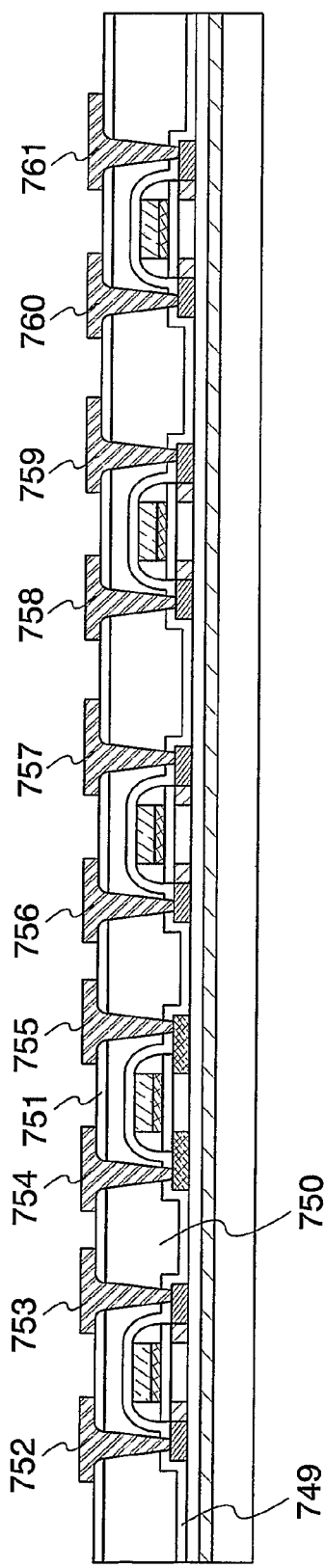
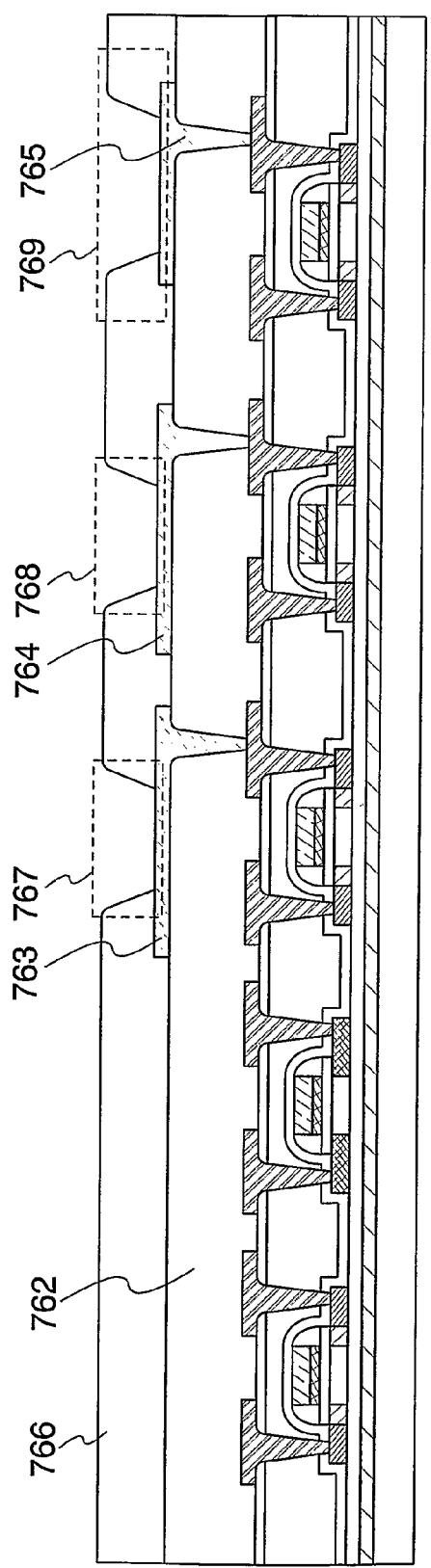
FIG. 12A
FIG. 12B

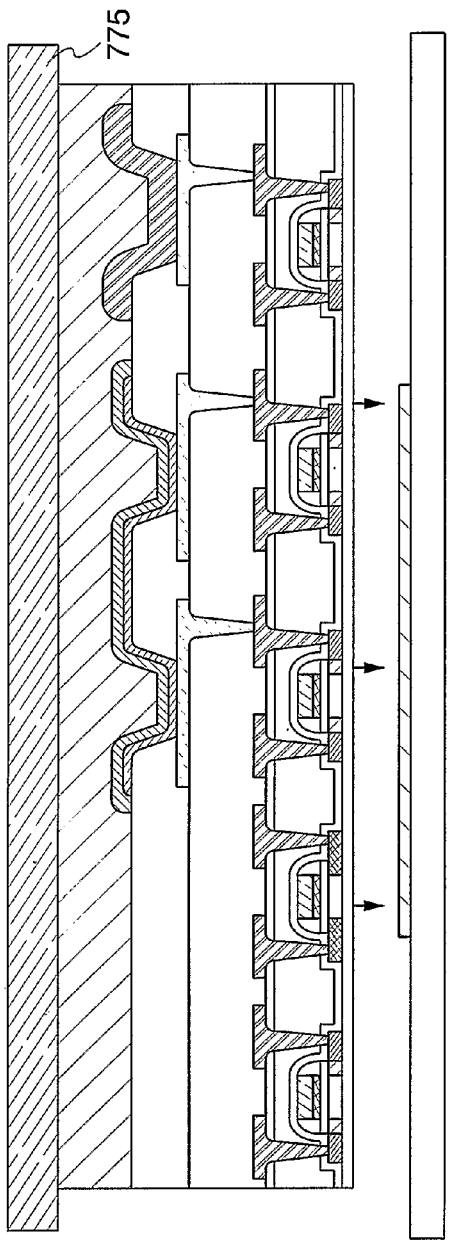
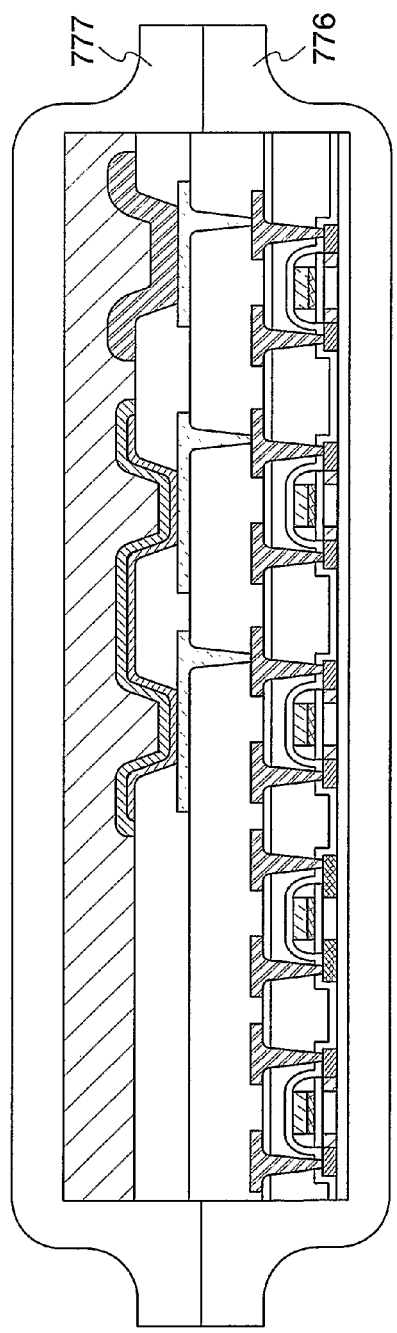
FIG. 15A
FIG. 15B

SEMICONDUCTOR DEVICE AND METHOD FOR MANUFACTURING THE SAME

TECHNICAL FIELD

The present invention relates to a semiconductor device that can transmit and receive data without contact, and relates to a method for manufacturing the same.

BACKGROUND ART

In recent years, an object recognition technology which is useful for production, management of objects and the like by assigning an identification (ID) number to each object and identifying history of the object, has been attracting attention. In particular, a development of a semiconductor device which can transmit and receive data without contact, has been carried out. As such a semiconductor device, RFIDs (radio frequency identifications, also referred to as ID tags, IC tags, IC chips, RF (radio frequency) tags, wireless tags, electronic tags, and wireless chips) and the like have been introduced in businesses, markets and the like.

Many of semiconductor devices such as RFIDs, which have been already put into practical use, comprise element formation layers (also, referred to as IC (integrated circuit) chips) each having a circuit including a transistor and the like, and antennas. These semiconductor devices can transmit and receive data to a reader/writer via the antennas by electromagnetic waves.

As a method for forming a conductor film having a function of an antenna in the above semiconductor device, a method for increasing a surface area and reducing resistance by which a film thickness can be increased, has been generally used. Therefore, in many cases, a conductive film is generally formed by using a plating method. When forming a conductive film serving as an antenna by the plating method, however, there are problems that a quality of a conductive film formed by the plating method is not sufficient, and the environment and the like are adversely affected by waste fluid and the like caused by the plating method. Meanwhile, in the case of forming a conductive film using a method other than the plating method, there are problems of being difficult to increase the thickness of the conductive film, securing a sufficient cross sectional area and a sufficient surface area of the conductive film, and the like.

DISCLOSURE OF INVENTION

In view of the above mentioned problems, an object of the present invention is to provide a semiconductor device having a conductive film that sufficiently serves as an antenna, and a method for manufacturing the semiconductor device.

In order to solve the above mentioned object, the prevent invention takes the following measures.

In an aspect of the present invention, a semiconductor device has an element formation layer including a transistor provided over a substrate; and a conductive film serving as an antenna provided over the element formation layer, wherein the transistor and the conductive film are electrically connected to each other, and a cross section of the conductive film has a concave shape. A thin film transistor (TFT), a field effect transistor (FET), or the like can be used as the transistor.

In another aspect of the present invention, a semiconductor device has an element formation layer including a transistor provided over a substrate; an insulating film provided on the element formation layer; and a conductive film serving as an antenna provided on the insulating film, wherein the transistor and the conductive film are electrically connected to each other, the insulating film has a groove, and the conductive film is provided along the surface of the insulating film and the groove. The groove of the insulating film may be provided to pass through the insulating film. Alternatively, a concave portion may be provided in the insulating film as the groove so as not to pass through the insulating film. A structure of the groove is not particularly limited. For example, the groove may be provided such that a cross section thereof has a tapered shape.

As another aspect of the present invention, a semiconductor device has an element formation layer including an transistor provided over a substrate; and an antenna formation layer including an insulating film and a conductive film, wherein the insulating film has a groove, a conductive film is provided along a surface of the insulating film and the groove, and the transistor and the conductive film are electrically connected to each other by a conductive microparticle.

The above described semiconductor device can be used for an RFID and the like, and can also be applied to any case of an electromagnetic induction system, an electromagnetic coupling system, a microwave system, and the like. In the case of the electromagnetic induction system or the electromagnetic coupling system, an antenna is preferably provided to have a coiled shape. In the case of the microwave system, since a shape of an antenna depends on a wavelength of an electromagnetic wave to be received, the shape is arbitrarily changed depending on a use situation.

In another aspect of the present invention, a method for manufacturing a semiconductor device has the steps of: forming an element formation layer including a transistor over a substrate; forming an insulating film having a groove on the element formation layer; forming a conductor film along a surface of the insulating film and the groove; forming a pattern of the conductive film by selectively removing a part of the conductive film formed on the surface on the insulating film; and forming a protection film to cover the conductive film.

In another aspect of the present invention, a method for manufacturing a semiconductor device has the steps of: forming a separation layer over a substrate; forming an element formation layer including a transistor over the separation layer; forming an insulating layer having a groove over the element formation layer; forming a conductive film along a surface of the insulating film and the groove; forming a pattern of the conductive film by selectively removing a part of the conductive film formed on the insulating film; forming a protection film to cover the conductive film; forming an opening by selectively removing the protection film, the insulating film and the element formation layer to expose the separation layer therethrough; removing the separation layer by introducing an etching agent in the opening; and separating the element formation layer from the substrate.

In another aspect of the present invention, a method for manufacturing a semiconductor device has the steps of: forming a separation layer over a first substrate; forming an element formation layer including a transistor over the separation layer; forming an insulating film having a groove over the element formation layer; forming a conductive film along a surface of the insulating film and the groove; forming a pattern of the conductive film by selectively removing a part of the conductive film formed on the surface of the insulating film; forming a protection film so as to cover the conductive film; forming an opening by selectively removing the protection film, the insulating film, and the element formation layer to expose the separation later therethrough; removing a part of the separation layer by introducing an etching agent in the opening; attaching a second substrate to a surface of the protection film; and separating the element formation layer from the first substrate by using a physical means.

By using the method for manufacturing the semiconductor device of the present invention, a generation of a harmful substance such as waste fluid can be prevented, and a cross sectional area and a surface area of a conductive film serving as an antenna can be enlarged. Moreover, as compared to the case where a conductive film serving as an antenna is provided over a flat surface, a surface area and a cross sectional area of a conductive film can be enlarged in a semiconductor device of the present invention, and hence, a communication distance, a communication band and the like can be improved. In addition, increasing a contact area between a conductive film serving as an antenna and an insulating film allows to improve the adhesiveness therebetween.

BRIEF DESCRIPTION OF DRAWINGS

FIGS. 11A to 11C are cross sectional views showing an example of a method for manufacturing a semiconductor device of the present invention;

FIGS. 12A and 12B are cross sectional views showing an example of a method for manufacturing a semiconductor device of the present invention;

FIGS. 15A and 15B are cross sectional views showing an example of a method for manufacturing a semiconductor device of the present invention;

BEST MODE FOR CARRYING OUT THE INVENTION

Figure 1A:
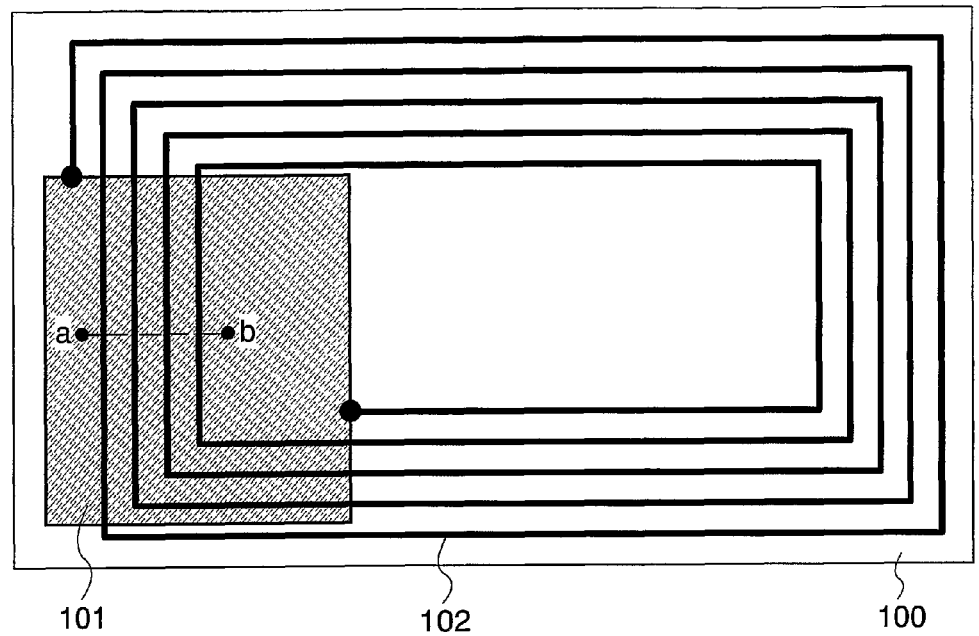
FIGS. 1A to 1D are diagrams showing a structural example of a semiconductor device of the present invention.

The embodiment modes according to the present invention will hereinafter be described. It is easily understood by those skilled in the art that the embodiment modes and details herein disclosed can be modified in various ways without departing from the purpose and the scope of the invention. The present invention should not be interpreted as being limited to the description of the embodiment modes to be given below. Moreover, reference numerals representing the same portions of the present invention described below are sometimes commonly used in the drawings.

Embodiment Mode 1

In this embodiment mode, a structural example of a semiconductor device of the present invention will be described with reference to the drawings.

Figure 1B:
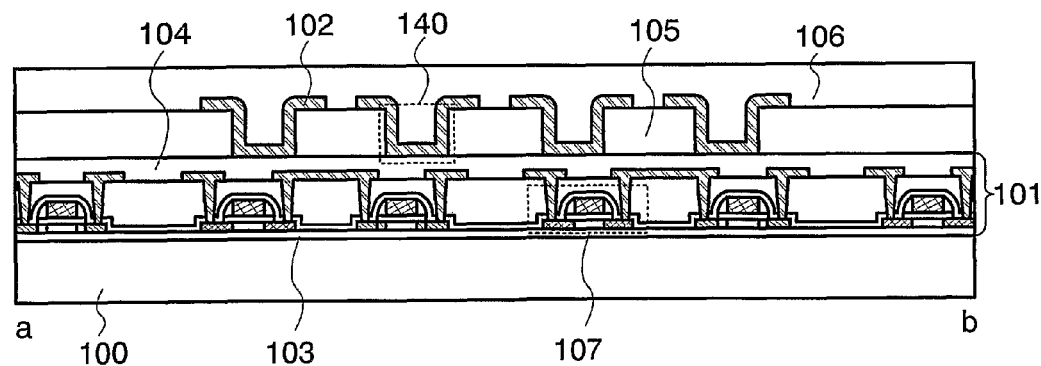

In a semiconductor device as shown in FIGS. 1A and 1B, a first insulating film 103 is provided over a substrate 100, an element formation layer 101 having a transistor 107, a second insulating film 104, and the like is provided on the first insulating film 103, and a conductive film 102 serving as an antenna is provided on the second insulating film 104. In FIGS. 1A to 1D, the conductive film 102 is provided to be at least in contact with the second insulating film 104 and a third insulating film 105.

The third insulating film 105 is provided on the second insulating film 104, and has a groove 140 of which a cross section has a concave shape. The groove 140 may be provided to pass through the third insulating film 105 to expose the second insulating film 104 through the groove. Alternatively, the third insulating film 105 may be concaved to form the groove 140 such that the groove does not pass through the third layer 105. An example of providing the groove 140, which passes through the third insulating film 105, is shown here.

The conductive film 102 is provided to cover a surface of the second insulating film 104 which is exposed through the groove 140 and an edge of the third insulating film 105 at the groove 140. In this case, the conductive film 102 is in contact with a part of a top surface of the third insulating film 105 and a side surface of the third insulating film 105 in the groove 140. Further, the conductive film 102 is not necessary to be provided on the surface of the third insulating film. Alternatively, the conductive film 102 can be provided to be in contact with the second insulating film 104 and the side surface of the third insulating film 105 in the groove 140. Further, the groove 140 is provided in the third insulating film 150, such that a part of the groove has a coiled shape in a direction perpendicular to the substrate.

Figure 1C:
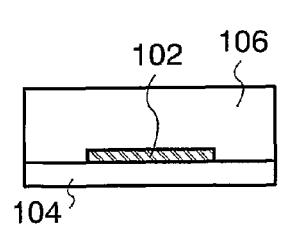
Figure 1D:
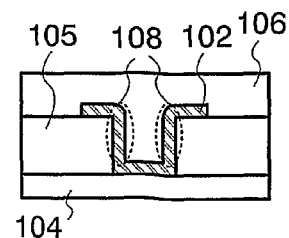

A fourth insulating film 106 serving as a protection film, is further provided to cover the conductive film 102 in FIGS. 1B and 1D. In this case, the fourth insulating film 106 is also provided in the concave portion of the conductive film 102. FIG. 1A shows a top view of the semiconductor device shown in this embodiment mode, whereas FIG. 1B shows a cross sectional view along a line a-b of FIG. 1A. Further, the size of the conductive film 102 serving as the antenna, which is provided over a plurality of transistors 107, is the same as the size of each transistor 107 in FIG. 1B. However, the conductive film 102 is actually provided to be greatly larger than the transistor 107.

As the substrate 100, a glass substrate such as barium borosilicate glass and alumino borosilicate glass, a quartz substrate, a ceramic substrate, or the like can be used. Also, a metal substrate containing stainless steel or a semiconductor substrate over which an insulating film is provided may be used. In addition, plastic typified by polyethylene terephthalate (PET), polyethylene naphthalate (PEN), and polyether sulfone (PES), a flexible substrate formed using a synthetic resin such as acrylic, or the like can be used. By utilizing a flexible substrate, a semiconductor device can be bent.

As the first insulating film 103, a single layer structure of an insulating film having silicon or/and nitrogen such as silicon oxide (SiOx), silicon nitride (SiNx), silicon oxynitride (SiOxNy) (x>y), and silicon nitride oxide (SiNxOy) (x>y); or a laminated structure thereof can be used. Further, in the case of using a flexible substrate as the substrate 100, when the element formation layer 101 is attached to the substrate 100, the first insulating film 103 may include an adhesive layer together with the silicon oxide, silicon nitride or silicon oxynitride. As the adhesive layer, adhesive agents such as a resin material containing an acrylic resin or the like, a material containing synthetic rubber, a thermosetting resin, an ultraviolet curing resin, an epoxy resin adhesive agent, a light curing adhesive agent, a moisture curing adhesive agent, and a resin additive agent, can be given. Further, in the case where there is no possibility of contaminations and the like to the transistor 107 and the like from the substrate 100, the first insulating film 103 is not necessary to be provided.

Each of the second insulating film 104, the third insulating film 105 and the fourth insulating film 106 can be formed to include a single layer structure or a laminated structure by using an insulating film containing oxygen or/and nitrogen such as silicon oxide, silicon nitride, silicon oxynitride, and silicon nitride oxide; an organic material such as polyimide, polyamide, polyvinyl phenol, benzocyclobutene, acrylic, and epoxy; a siloxane material; and the like. Further, the siloxane material corresponds to a substance that has a skeleton structure by a bond of silicon and oxygen and contains at least hydrogen in a substituent, or a substance that has a skeleton structure formed by a bond of silicon and oxygen and contains at least one of fluorine, an alkyl group, and aromatic hydrocarbon.

The element formation layer 101 includes at least the transistor 107. As the transistor 107, for example, a thin film transistor (TFT) may be provided over a substrate made from glass or the like, or a field effect transistor (FET) may be provided over a semiconductor substrate such as Si while utilizing the semiconductor substrate as a channel. Alternatively, an organic TFT may be provided over a flexible substrate. By the transistor 107, each and every integrated circuit such as a CPU, a memory and a microprocessor can be provided. FIG. 1B shows an example in which a thin film transistor is provided as the transistor 107. Further, the transistor 107 has a CMOS structure combining an n-channel type semiconductor and a p-channel type semiconductor. In addition, an impurity region (including a source region, a drain region and an LDD region) is provided in a semiconductor film, and an insulating film (sidewall) is provided to be in contact with a side surface of a gate electrode. In Embodiment Mode 1, an example in which an LDD region is provided in an n-channel type semiconductor film and an LDD region is not provided in a p-channel type semiconductor film, is shown. However, an LDD region may also be provided in the p-channel type semiconductor film, as well as the n-channel type semiconductor film. Also, a silicide layer such as nickel, molybdenum and cobalt may be provided in one or both of a source/drain region and the gate electrode.

The conductive film 102 can be formed by sputtering, CVD, or the like using a conductive material containing one or more metals such as copper (Cu), aluminum (Al), silver (Ag), gold (Au), chromium (Cr), molybdenum (Mo), titanium (Ti), tantalum (Ta), tungsten (W), nickel (Ni) and carbon (C); or one or more metal compounds.

In FIG. 1B, the third insulating film 105 having the groove 140 of which a cross section has a concave shape, is formed on the second insulating film 104, and the conductive film 102 is provided along the top surface of the second insulating film 104 in the groove 140 and the side surface of the third insulating film 105. In this case, after forming a conductive film over an entire surface by sputtering or CVD, the conductive film is selectively etched by photolithography so that the conductive film 102 can be provided. Providing the conductive film 102 in this manner (FIG. 1D) makes it possible to enlarge a cross sectional area and a surface area of the conductive film 102, as compared to the case where a conductive film is provided to have a cross section with a rectangular shape over a flat surface (FIG. 1C). That is, when the conductive film 102 is provided on the second insulating film 104 (FIG. 1C), the cross section of the conductive film 102 becomes a rectangular shape. On the other hand, when the groove 140 of which the cross section has a concave shape, is provided in the third insulating layer 105 and the conductive film 102 is formed along the groove 140, the cross section of the conductive film 102 also becomes a concave shape. Therefore, by providing the conductive film 102 along the groove 140 of which the cross section has the concave shape, provided in the third insulating film 105 (FIG. 1D), a cross sectional area and a surface area of the conductive film 102 are increased for a portion 108 where is in contact with the side surface of the third insulating film 105, as compared to the case of FIG. 1C. By increasing the cross sectional area and the surface area of the conductive film serving as an antenna in such a manner, when data is exchanged without contact between a semiconductor device and an external device (e.g., a reader/writer), a communication distance and a communication band therebetween can be increased. In addition, increasing a contact area between the conductive film serving as the antenna and the insulating film makes it possible to improve the adhesiveness therebetween.

In FIGS. 1B and 1D, the third insulating film 105 having the groove 140 is formed on the second insulating film 104, and the conductive film 102 is selectively provided on the second insulating film 104 and the third insulating film 105. However, a semiconductor device shown in this embodiment mode is not limited to this structure. Specific examples of semiconductor devices having other structures are shown in FIGS. 2A to 2D.

Figure 2A:
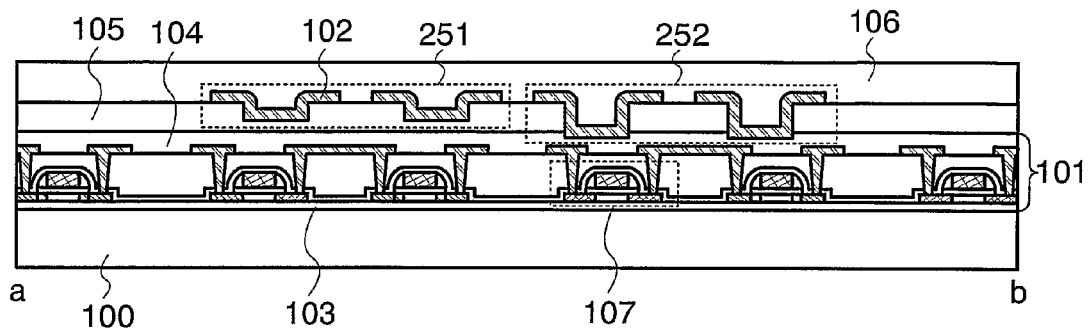
FIGS. 2A to 2D are cross sectional views showing structural examples of semiconductor device of the present invention.

In a semiconductor device shown in FIG. 2A, a third insulating film 105 having a groove of which a cross section has a concave shape, is provided on a second insulating film 104, and a conductive film 102 is provided along the groove (a region 251). Specifically, the groove provided in the third insulating film 105 does not pass through the third insulating film, the conductive film 102 is only in contact with the third insulating film 105, and the conductive film 102 is provided so as to cover a concaved surface of the third insulating film 105 and an edge of the concave portion. The concave portion of the third insulating film 105 can be formed by selectively etching the third insulating film 105 provided on the second insulating film 104. In this case, by controlling an etching condition, a concave portion having an arbitral shape can be formed. Alternatively, after forming the third insulating film 105 on the second insulating film 104, a concave portion may be formed in the third insulating film 105 and the second insulating film 104, and then a conductive film 102 may be provided (a region 252).

Figure 2B:
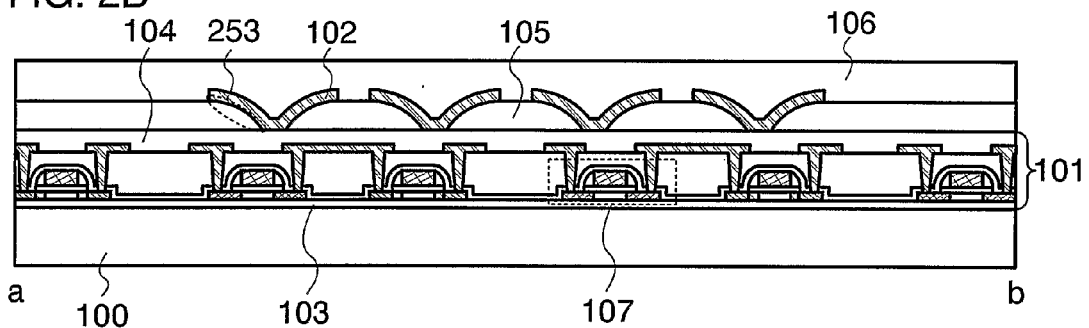

In a semiconductor device shown in FIG. 2B, corners 253 of a third insulating film 105, which is provided on a second insulating film 104, are curved such that the third insulating film 105 has a groove of which a cross section has a tapered shape. A second conductive film 102 is provided to cover a surface of the second insulating film 104 in the groove and the tapered portion of the third insulating film 105. That is, FIG. 2B corresponds to a case where the groove 140 of the third insulating film 105 shown in FIGS. 1B and 1D is provided to have a cross section with a tapered shape. By providing the third insulating film 105 having the groove 140 of which the cross section has the tapered shape, a disconnection of the conductive film 102 in a depth direction, which might be caused when providing the conductive film 102, can be prevented.

Figure 2C:
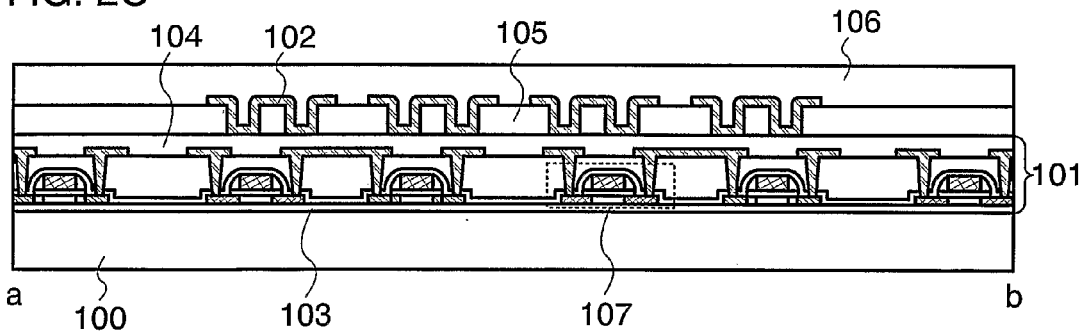

In a semiconductor device shown in FIG. 2C, the number of concave portions formed in the third insulating film 105 provided on the second insulating film 104 shown in FIG. 1B, is doubled, and a conductive film 102 is provided such that a cross section thereof has convexity and concavity. That is, by increasing the number of the cross sections of the groove 140 formed in the third insulating film 105 and providing the conductive film 102 in the groove, a cross sectional area and a surface area of the conductive film 102 can be further increased. Further, although the number of concave portions is doubled here, it can, of course, be further increased.

Figure 2D:
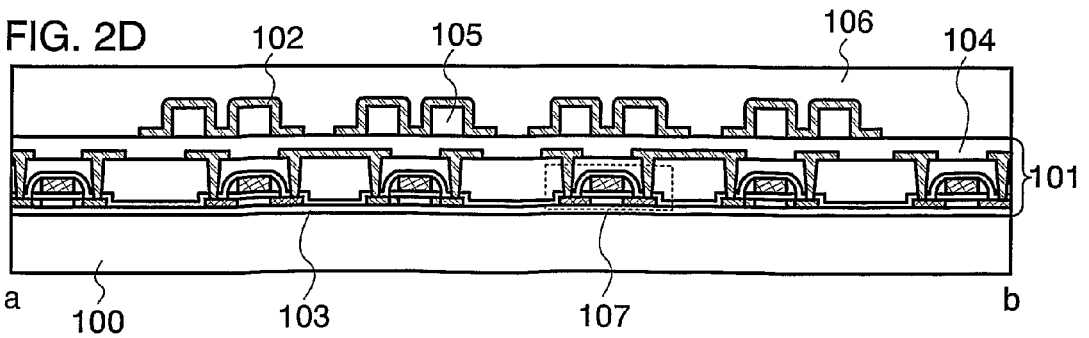

In a semiconductor device shown in FIG. 2D, the conductive film 102 of FIG. 2C is arranged upside down. By providing the conductive film 102 to have concavity and convexity in this manner, a cross sectional area and a surface area of the conductive film 102 in a certain region can be increased.

Further, the structures shown in FIGS. 2B to 2D may also be arranged like the structure shown in FIG. 2A. That is, the groove is provided such that the second insulating film 104 is exposed through the groove in each FIGS. 2B to 2D. Alternatively, a groove of which a cross section has a concave shape, can be provided in a third insulating film 105 so as not to pass through the third insulating film, and a conductive film 102 can be provided to be only in contact with the third insulating film 105. Furthermore, as shown in the region 252 of FIG. 2A, a structure in which a groove having a cross section with a concave shape, is provided in the second insulating film 104, can also be employed.

In addition, although the third insulating film 105 is provided on the second insulating film 104 in each semiconductor device shown in FIG. 1B and FIGS. 2A to 2D, the third insulating film 105 can be provided on a source wiring or a drain wiring of a transistor 107 without providing the second insulating film 104. In this case, a groove provided in the third insulating film 105 may be provided to pass through the third insulating film, or provided so as not to pass therethrough. When the groove is provided to pass through the third insulating film 105, the conductive film 102 can be provided in the same layer as the source wiring or the drain wiring of the transistor 107. In this case, the process can be simplified by forming the conductive film 102 and the source or drain wiring using a same material.

In order to miniaturize the semiconductor device in FIG. 1B, the element formation layer 101 and the conductive film 102 are provided such that they are at least partly overlapped with each other. However, the semiconductor device shown in this embodiment mode is not limited to this structure, and the element formation layer 101 and the conductive film 102 may be provided so as not to overlap with each other. Further, the cases of the electromagnetic coupling system or the electromagnetic induction system are shown in FIG. 1B and FIGS. 2A to 2D. However, the above described structures can be applied to semiconductor device employing the microwave system. A specific example of this case is shown in FIGS. 3A to 3C.

An antenna of a semiconductor device using the electromagnetic coupling system or the electromagnetic induction system is generally required to have a coiled shape. On the other hand, a shape of an antenna of a semiconductor device employing the microwave system depends on a type of an electromagnetic wave to be received. In order to explain briefly, a case of using a pole-shaped antenna, which has a simple structure, is shown here (FIGS. 3A to 3C).

Figure 3A:
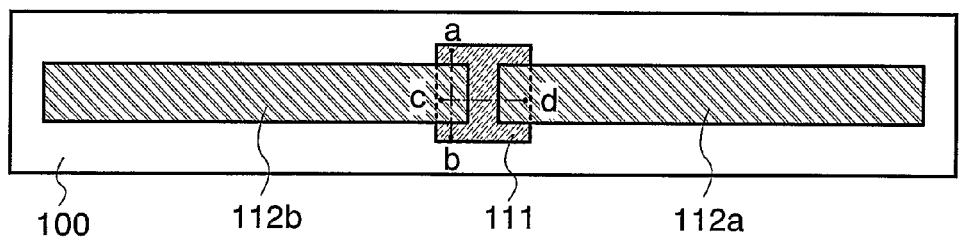
FIGS. 3A to 3C are diagrams showing structural examples of semiconductor devices of the present invention.

In FIG. 3A, an element formation layer 111 is provided over a substrate 100, and conductive films 112a and 112b serving as an antenna are provided to be connected to the element formation layer 111. Cross sectional structures along a line a-b and a line c-d in FIG. 3A are respectively shown in FIGS. 3B and 3C.

Figure 3B:
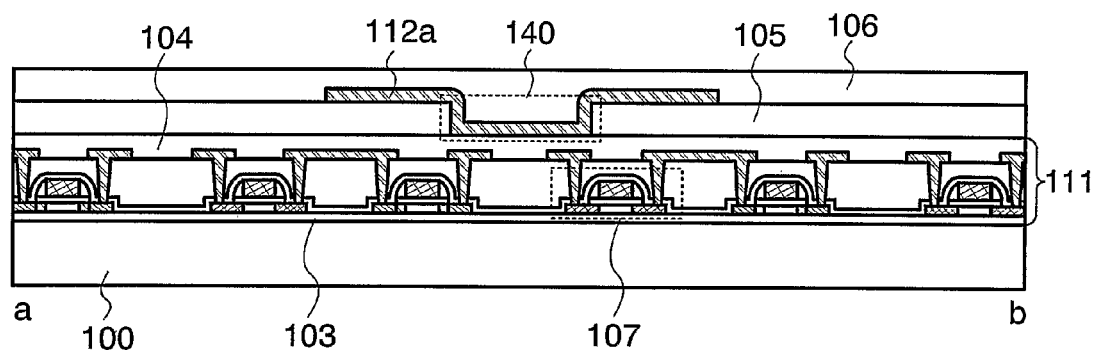
Figure 3C:
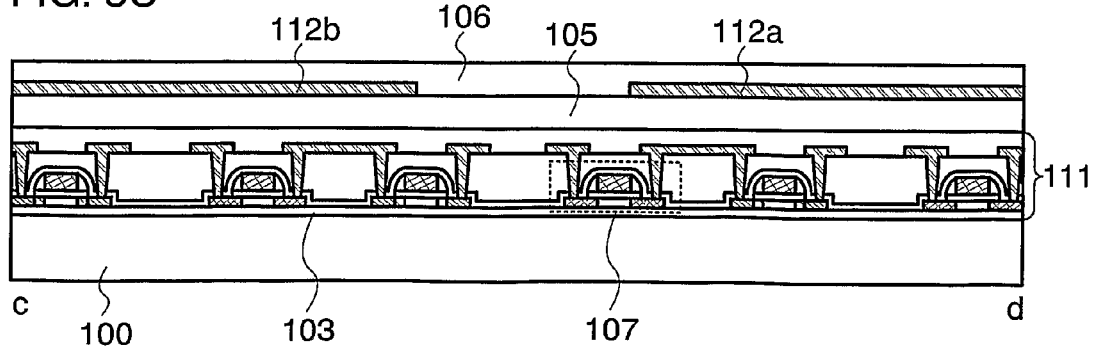

An element formation layer 111 having a transistor 107 and the like is provided over the substrate 100 while interposing a first insulating film 103 therebetween, and conductive films 112a and 112b serving as an antenna are provided over the element formation layer 111 through a second insulating film 104 (in each FIGS. 3B and 3C). The conductive films 112a and 112b are provided on the second insulating film 104 and the third insulating film 105 so as to cover the edge of the third insulating film 105, which is selectively provided on the second insulating film 104. The conductive films 112a and 112b are electrically connected to any of transistors in the element formation layer 111. Here, the third insulating film 105 has an opening such that the conductive films 112a and 112b are connected to a side surface of the third insulating film. Further, a fourth insulating film 106 is provided to cover the conductive films 112a and 112b.

The conductive films 112a and 112b serving as the antenna are provided to cover a surface of the second insulating film 104 and the edge of the third insulating film 105. Further, the conductive films 112a and 112b can be formed by using the same method and the same material as the above described conductive film 102.

Figure 16A:
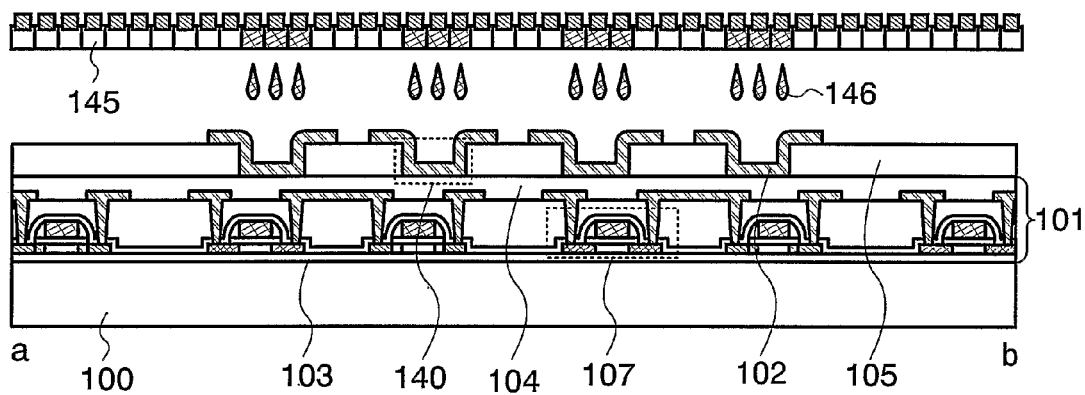
FIGS. 16A and 16B are cross sectional views showing a structural example of a semiconductor device of the present invention.
Figure 16B:
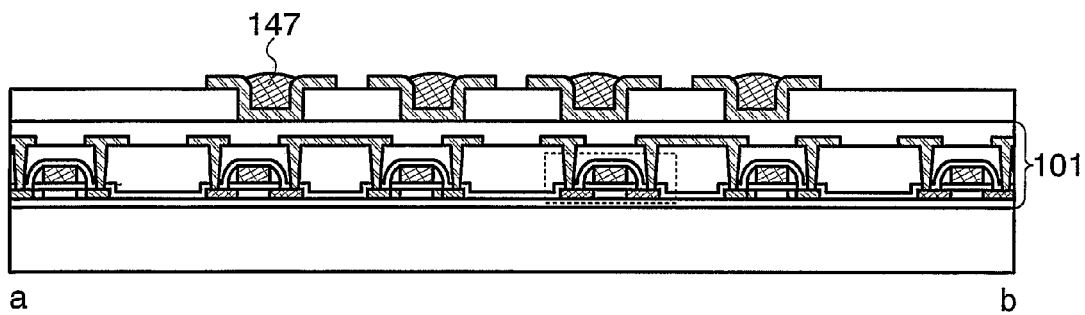

Furthermore, in order to increase a cross sectional area of the conductive film 102 serving as the antenna in each of FIG. 1B and FIGS. 2A to 2D or the conductive films 112a and 112b serving as the antenna in FIGS. 3A to 3C, it is preferable that a conductive body be selectively provided in a concave portion of the conductive film 102 or the conductive films 112a and 112b. For instance, as shown in FIG. 16A, when a composition 146 having a conducting property is selectively discharged in a concave portion of the conductive film 102 through a nozzle 145 by using a droplet discharging method, a cross sectional area can be increased. As for the composition 146 having the conducting property, a conductive material containing one or more metals such as Ag, Au, Cu and Pd, or one or more metal compounds can be used. Further, a conductive material containing one or more metals such as Cr, Mo, Ti, Ta, W and Al, or one or more metal compounds can be used if the conductive material can be dispersed in a solution while preventing aggregation of the conductive material with a dispersing agent. In addition, the composition 146 having the conducting property may be selectively formed in the concave portion of the conductive film 102 by using screen printing or a dispenser. As a consequence, a cross sectional area of a conductive film serving as an antenna becomes a sum of a cross sectional area of a conductive film 102 and a cross sectional area of a conductive body 147, and hence, the total cross sectional area can be increased (FIG. 16B).

As set forth above, by forming a semiconductor device such that a cross sectional area and a surface area of a conductive film serving as an antenna is increased, a communication distance and a communication band of the semiconductor device can be improved. Moreover, increasing a contact area between a conductive film serving as an antenna and an insulating film makes it possible to improve the adhesiveness therebetween.

Embodiment Mode 2

In this embodiment mode, an example of a method for manufacturing a semiconductor device as shown in Embodiment Mode 1 will be described with reference to the drawings. In this embodiment mode, after forming an element formation layer and an antenna over a substrate with rigidity such as glass once, the element formation layer and the antenna are separated from the substrate with the rigidity, and then they are provided over a flexible substrate.

Figure 4A:
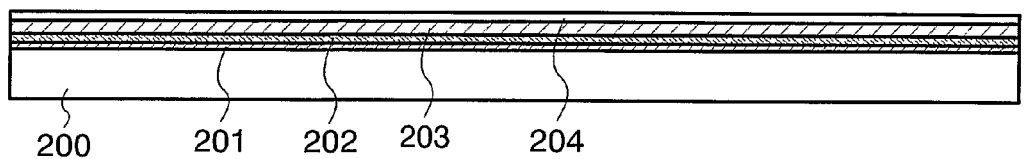
FIGS. 4A to 4D are cross sectional views showing an example of a method for manufacturing a semiconductor device of the present invention.

An insulating film 201, which serves as a base film, is formed over a substrate 200, a separation layer 202 is provided thereon, and an insulating film 203 and a semiconductor film 204 are laminated over the separation layer 202 (FIG. 4A). The insulating film 201, which serves as the base film, is provided to prevent the separation layer 202 from being contaminated from the substrate 200. When there is no possibility of the contamination and the like from the substrate 200, however, the insulating film 201 is not necessarily provided. Further, the insulating film 201, the separation layer 202, the insulating film 203, and the semiconductor film 204 can be successively formed in a vacuum process.

Figure 4B:
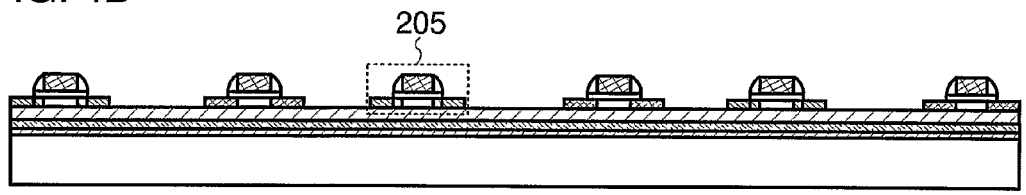

Next, the semiconductor film 204 is selectively etched to form a plurality of island-like semiconductor films. Gate electrodes are formed over the island-like semiconductor films through gate insulating films to complete a plurality of thin film transistors 205 (FIG. 4B).

Figure 4C:
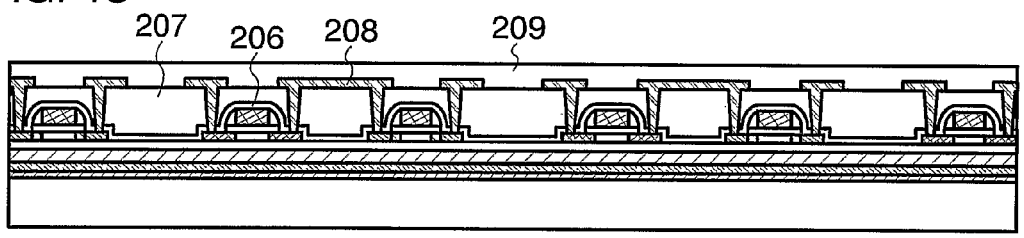

Next, an insulating film 206 is formed to cover the thin film transistors 205, and an insulating film 207 is formed thereon to planarize a surface. Next, openings are selectively provided in the insulating films 206 and 207, and a conductive film 208 is provided to be electrically connected to a source region and a drain region of each thin film transistor 205 through the openings. Afterwards, an insulating film 209 is formed to cover the conductive film 208 (FIG. 4C).

Figure 4D:
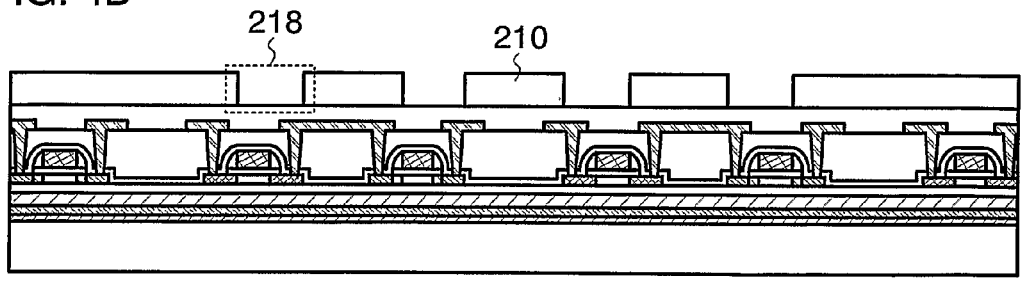

Next, an insulating film 210 is selectively formed over the insulating film 209 (FIG. 4D). The insulating film 210 has a groove 218. After forming the insulating film 210 on an entire surface of the insulating film 209, the groove 218 may be formed in the insulating film 210 by photolithography. Alternatively, the groove 218 may be provided by selectively forming the insulating film 210 using a printing method such as screen printing or a droplet discharging method. Utilizing the printing method or the droplet discharging method makes it possible to reduce the number of manufacturing steps. Further, the groove 218 of the insulating film 210 can employ any one of the structures shown in Embodiment Mode 1.

Figure 5A:
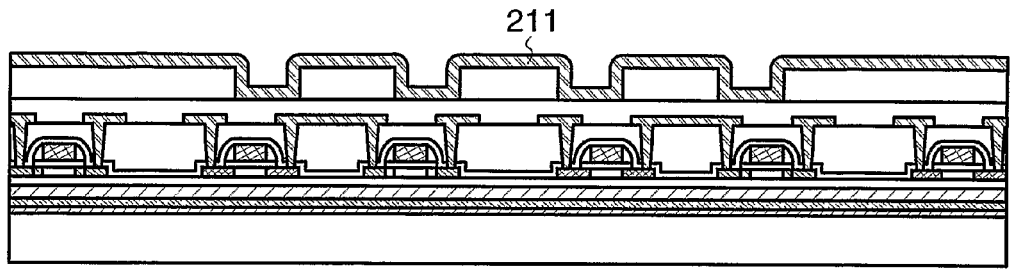
FIGS. 5A to 5D are cross sectional views showing an example of a method for manufacturing a semiconductor device of the present invention.

Next, a conductive film 211 is formed to cover the insulating film 209 and the insulating film 210 (FIG. 5A). The conductive film 211 is provided to be in contact with a top surface of the insulating film 209, which is exposed through the groove 218, and a side surface and a top surface of the insulating film 210, here. Further, in order to prevent a disconnection of the conductive film 211 at the groove 218, corners of the insulating film 210 are preferably curved so that a cross section of the groove 218 has a tapered shape.

Figure 5B:
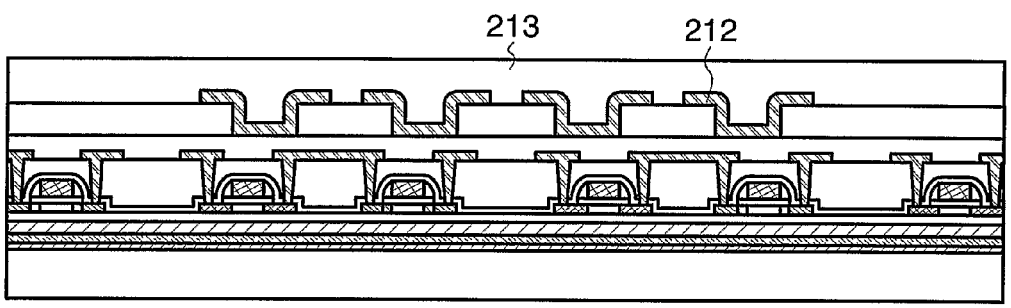

Next, a conductive film 212 is formed by selectively etching the conductive film 211, and then an insulating film 213 is formed to cover the conductive film 212 (FIG. 5B).

Figure 5C:
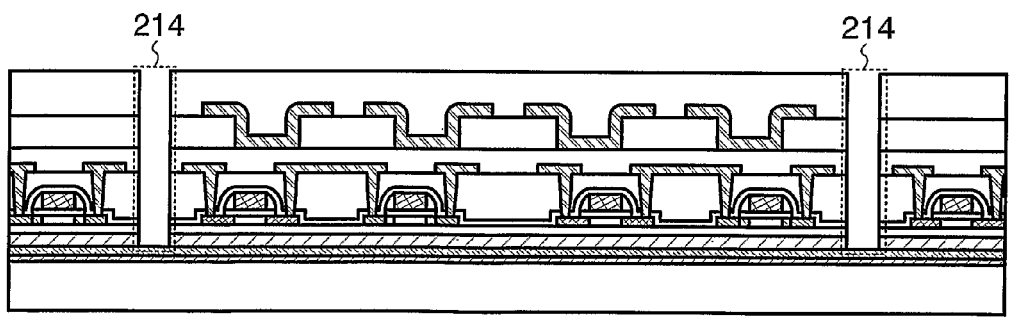
Figure 5D:
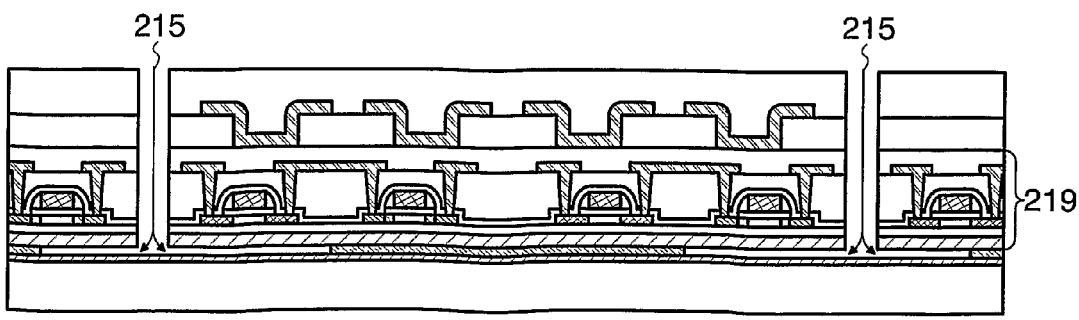

By selectively removing the insulating films 203, 206, 207, 209, 210 and 213, openings 214 are formed to expose the separation layer 202 therethrough (FIG. 5D). Further, the openings 214 are provided in regions other than regions provided with the thin film transistors 205. The openings 214 can be formed by laser beam irradiation or photolithography.

Next, an etching agent 215 is introduced in the openings 214 to remove the separation layer 202 (FIG. 5D). The separation layer 202 may be entirely removed, or partly removed by controlling an etching condition. Leaving a part of the separation layer 202 makes it possible to prevent the element formation layer 219 and the like from being entirely separated from the substrate 200 after removing the separation layer 202. In addition, the etching time can be shortened and an amount of an etching agent to be used can be reduced, thereby improving an operation efficiency and reducing cost.

Figure 6A:
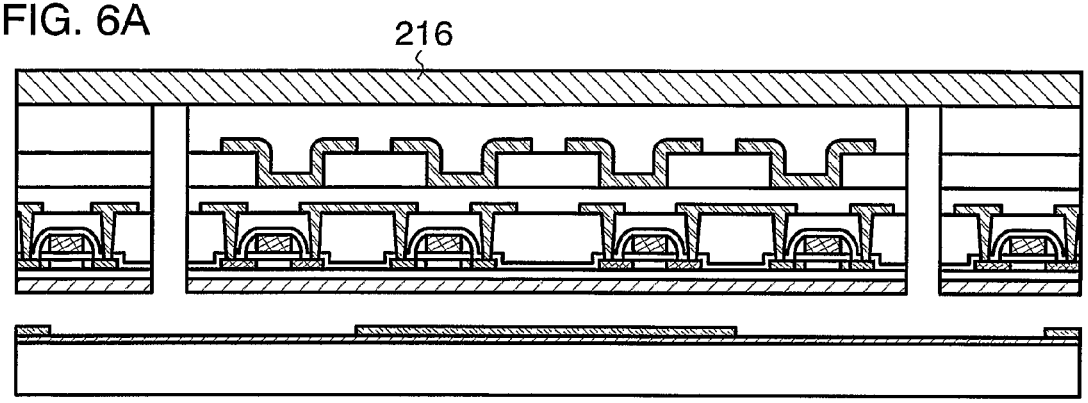
FIGS. 6A and 6B are cross sectional views showing an example of a method for manufacturing a semiconductor device of the present invention.

Next, a substrate 216 having an adhesive property is attached to the insulating film 213, and then the element formation layer 219 is separated from the substrate 200 (FIG. 6A). Since the substrate 200 and the insulating film 203 of the element formation layer 219 are partly connected to each other by a part of the remaining separation layer, the element formation layer 219 and the like are separated from the substrate 200 by using a physical means.

Further, an example of removing the separation layer 202 by using the etching agent 215 is shown here, however, the separation layer 202 is not necessarily removed by using the etching agent. That is, when the element formation layer 219 is not well-adhered to the separation layer 202 after forming the openings 214, the element formation layer 219 can be separated from the substrate 200 by using a physical means. In this case, since the etching agent is not necessary to be used, the process can be shortened and the cost can be reduced.

Figure 6B:
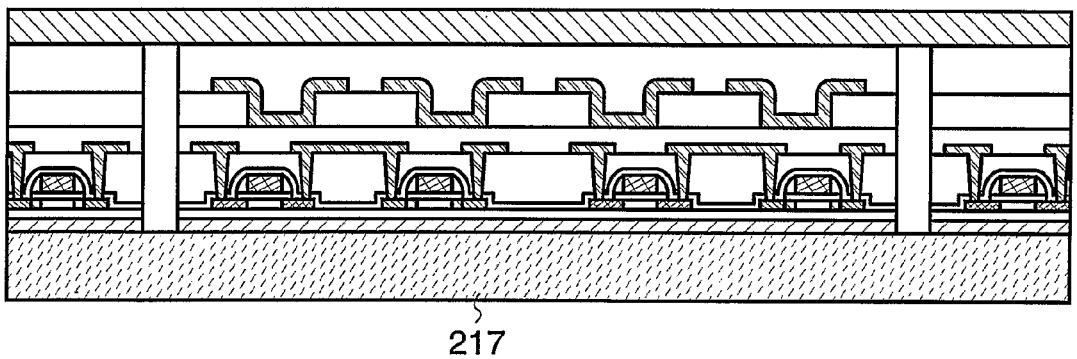

Next, a flexible substrate 217 is attached to the surface of the insulating film 203 (FIG. 6B).

Through the above mentioned processes, a semiconductor device having an element formation layer, an antenna, and the like can be provided over a flexible substrate. Materials used in the above described processes, and the like will concretely be described below.

As the substrate 200, a glass substrate, a quartz substrate, a metal substrate, a stainless steel substrate having a surface provided with an insulating film, or the like can be used. There are no limitations in areas and shapes of these substrates. For example, when using a rectangular substrate having 1 meter on a side as the substrate 200, the productivity can be significantly improved. This is a greater advantage as compared to a case of using a circular silicon substrate. Moreover, since the separated substrate 200 can be reused in this embodiment mode, semiconductor devices can be manufactured at lower cost. For example, even in the case where an expensive quartz substrate is employed, by using the quartz substrate repeatedly, semiconductor devices can be manufactured at low cost.

As the insulating film 201, a single layer structure of an insulating film containing silicon or/and nitrogen such as silicon oxide (SiOx), silicon nitride (SiNx), silicon oxynitride (SiOxNy) (x>y), and silicon nitride oxide (SiNxOy) (x>y); or a laminated structure thereof can be used. Such an insulating film can be formed by using a known method (various kinds of CVD methods such as sputtering and plasma CVD).

As the separation layer 202, a metal film, a laminated structure of a metal film and a metal oxide film, or the like can be used. The metal film can be formed in a single layer of a film made from an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os) and iridium (Ir); or a alloy material or a compound material mainly containing the above elements. Alternatively, the metal film can be formed by laminating films formed using the above mentioned materials. These materials can be formed by using various kinds of CVD methods such as sputtering and plasma CVD. With respect to a laminated structure of a metal film and a metal oxide film, after forming the above described metal film, a plasma treatment is performed under an oxygen atmosphere or an $N_2O$ atmosphere, or a heat treatment is performed under an oxygen atmosphere or an $N_2O$ atmosphere to form oxide or oxynitride of the metal film on the surface of the metal film. For example, when a tungsten film is formed as a metal film by sputtering or CVD, the tungsten film is subjected to a plasma treatment so as to form a metal oxide film made from tungsten oxide on the surface of the tungsten film. In this case, the tungsten oxide is expressed by WOx, wherein "x" is 2 to 3, and there are a case where "x" is 2 ($WO_2$), a case where "x" is 2.5 ($W_2O_5$), a case where "x" is 2.75 ($W_4O_{11}$), and a case where "x" is 3 ($WO_3$), and the like. In forming the tungsten oxide, the value of "x" is not particularly limited, and oxide to be formed may be determined depending on an etching rate and the like. In addition, for example, after forming a metal film (e.g., tungsten), an insulating film such as silicon oxide ($SiO_2$) may be provided on the metal film by sputtering and metal oxide may also be formed on the metal film (e.g., tungsten oxide is formed on tungsten). As the plasma treatment, for example, the above described high-density plasma treatment may be carried out. In addition to the metal oxide film, metal nitride or metal oxynitride may be used. In this case, a metal film may be subjected to a plasma treatment or a heat treatment under a nitrogen atmosphere or under a nitrogen and oxygen atmosphere.

The insulating film 203 can be formed by using either a single layer structure or a laminated structure of an insulating film containing oxygen or/and nitrogen such as silicon oxide (SiOx), silicon nitride (SiNx), silicon oxynitride (SiOxNy) (x>y), and silicon nitride oxide (SiNxOy) (x>y), by using a known method (such as sputtering and plasma CVD). In the case where the insulating film 203 is formed to have a two layered structure, for example, a silicon nitride oxide film may be formed as a first insulating film and a silicon oxynitride film may be formed as a second insulating film. Also, when the insulating film 203 is formed to have a three layered structure, a silicon oxynitride film may be formed as a first insulating film, a silicon nitride oxide film may be formed as a second insulating film, and a silicon oxynitride film may be formed as a third insulating film.

The semiconductor film 204 can be formed by using any one of an amorphous semiconductor, an SAS in which an amorphous state and a crystal state are mixed, a microcrystalline semiconductor in which crystal grains with 0.5 to 20 nm can be observed in an amorphous semiconductor, and a crystalline semiconductor. When a substrate, which can withstand a temperature of processing a film, such as a quartz substrate is used as the substrate 200, a crystalline semiconductor film may be formed over the substrate by CVD or the like. Further, the crystalline semiconductor film can be formed by forming an amorphous semiconductor film, and then by crystallizing the amorphous semiconductor film by a heat treatment. The heat treatment can be performed by using a heating furnace, laser irradiation, or irradiation of light emitted from a lamp instead of laser beam (lamp annealing); or a combination thereof. In the case of using the laser irradiation, a continuous wave laser (CW laser) or a pulsed oscillation laser (pulsed laser) can be used. As a laser, it is possible to use one or more kinds of an Ar laser, a Kr laser, an excimer laser, a YAG laser, a $Y_2O_3$ laser, $YVO_4$ laser, a YLF laser, a $YAlO_3$ laser, a glass laser, a ruby laser, an alexandrite laser, a Ti: sapphire laser, a copper vapor laser, and a gold vapor laser. By irradiating an amorphous semiconductor layer with a fundamental wave of such a laser and a second harmonic to a fourth harmonic of the fundamental wave, a large-size crystal grain can be obtained.

The thin film transistor 205 may have any structure. For instance, the thin film transistor 205 may include an impurity region (including a source region, a drain region and an LDD region), or a CMOS circuit formed by using a p-channel type semiconductor, an n-channel type semiconductor or a combination of a p-channel type and an n-channel type semiconductors. Further, an insulating film (a sidewall) may be formed to be in contact with a side surface of a gate electrode, which is provided over the semiconductor film. Also, a silicide layer or silicide layers such as nickel, molybdenum, and cobalt may be provided one or both of the source and drain region and the gate electrode.

The insulating film 206 can be formed by using a single layer structure or a laminated structure of an insulating film containing oxygen or/and nitrogen such as silicon oxide (SiOx), silicon nitride (SiNx), silicon oxynitride (SiOxNy) (x>y), and silicon nitride oxide (SiNxOy) (x>y), or a film containing carbon such as DLC (diamond like carbon), by using a known method (such as sputtering and plasma CVD).

Each of the insulating films 207, 209, 210 and 213 can be formed in a single layer structure or a laminated structure using an organic material such as epoxy, polyimide, polyamide, polyvinyl phenol, benzocyclobutene and acrylic; and a siloxane material, in addition to the above mentioned insulating film containing oxygen or/and nitrogen such as silicon oxide (SiOx), silicon nitride (SiNx), silicon oxynitride (SiOxNy) (x>y), and silicon nitride oxide (SiNxOy) (x>y) and the above mentioned film containing carbon such as DLC (diamond like carbon). In particular, since an organic material such as epoxy, polyimide, polyamide, polyvinyl phenol, benzocyclobutene and acrylic, a siloxane material, and the like can be formed by using spin coating, a droplet discharging method, a printing method or the like, a surface cam be planarized and a processing time efficiency can be improved. These insulating films 207, 209, 210, and 213 can be formed using a same material or different materials.

The conductive film 208 can be formed in a single layer structure or a laminated structure by using an element selected from Al, Ni, C, W, Mo, Ti, Pt, Cu, Ta, Au and Mn, or an alloy containing the plural elements. For example, as a conductive film made from an alloy containing the plural elements, for example, an Al alloy containing C and Ti (Al—Ti—C), an Al alloy containing Ni (Al—Ni), an Al alloy containing C and Ni (Al—Ni—C), an Al alloy containing C and Mn (Al—Mn—C), or the like can be used.

The conductive film 211 can be formed using a conductive material containing one or more metals such as copper (Cu), aluminum (Al), silver (Ag), gold (Au), chromium (Cr), molybdenum (Mo), titanium (Ti), tantalum (Ta), tungsten (W), nickel (Ni) and carbon (C), or a metal compound. In addition, the conductive film 211 can be selectively formed by using a paste (e.g., a silver paste) with a conducting property by screen printing.

As the substrate 216, a laminated film can be used. A film such as polyester on which a hot melt film is laminated can be used here. Also, when attaching the substrate 216 to the insulating film 213, the attachment can be efficiently carried out by performing one or both of a pressing treatment and a heat treatment. Furthermore, in order to prevent moisture and the like from penetrating into the element formation layer 219 through the film after sealing the element formation layer, the substrate 216 is preferably coated with a film including silicon oxide (SiOx), silicon nitride (SiNx), silicon oxynitride (SiOxNy) (x>y), or silicon nitride oxide (SiNxOy) (x>y) in advance.

Alternatively, a film subjected to an antistatic treatment for preventing static charge and the like (hereinafter, referred to as an antistatic film) can be used as the substrate 216. As the antistatic film, a film in which an antistatic material is dispersed in a resin, a film to which an antistatic material is pasted, and the like can be given. A film provided with an antistatic film may be either a film of which one surface is provided with an antistatic material, or a film of which both surfaces are provided with antistatic materials. Furthermore, a film of which one surface is provided with an antistatic material may be attached to a layer such that the antistatic material is in contact with the layer, or the other surface of the film is in contact with the layer. Furthermore, the antistatic material may be provided on an entire surface of the film, or a part of the film. As the antistatic material, metal, indium tin oxide (ITO), surfactant such as ampholytic surfactant, cationic surfactant and nonionic surfactant, or the like can be used. In addition, a resin material containing cross-linked copolymer that has a carboxyl group and a quaternary ammonium group in side chains, or the like can be used as the antistatic material. By attaching or applying these materials to a film, or by mixing them in a film, the film can be used as an antistatic film. By sealing an element formation layer with an antistatic film, a semiconductor element can be prevented from being adversely affected by static charge and the like caused in an external portion when dealing a semiconductor device as a product.

Furthermore, a case of manufacturing a semiconductor device having a coiled antenna is shown in this embodiment mode. However, a semiconductor device having an antenna with other shape can also be formed in the same manner as this embodiment mode.

The present embodiment mode can be implemented by being freely combined with the above embodiment mode.

Embodiment Mode 3

In this embodiment mode, a semiconductor device, which is different from the above described embodiment mode, and a method for manufacturing the same will be described with reference to the drawings. Specifically, a case where an element formation layer and an antenna are individually manufactured, and then the element formation layer and the antenna are connected, will be described. Further, a case of employing a coiled antenna will be described in this embodiment mode, however, a case of employing an antenna having other shape, can also be carried out in the same manner as the present embodiment mode.

An element formation layer can be formed by using the manufacturing method shown in FIGS. 4A to 4D. Therefore, only a method for manufacturing an antenna will be described below with reference to the drawings.

Figure 9A:
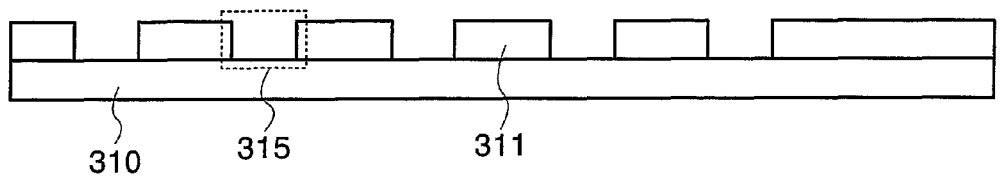
FIGS. 9A to 9D are cross sectional views showing an example of a method for manufacturing an antenna formation layer of a semiconductor device of the present invention.

First, an insulating film 311 having a groove 315 is selectively formed on a substrate 310 (FIG. 9A). Specifically, after providing the insulating film 311 on the entire surface of the substrate 310, the groove 315 may be formed in the insulating film 311 by photolithography. Alternatively, the insulating film 311 may be selectively provided on the substrate 310 by a printing method such as screen printing or a droplet discharging method to form the groove.

Figure 9B:
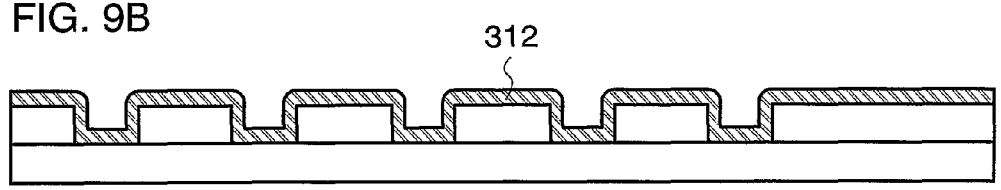

Next, a conductive film 312 is formed to cover the surface of the substrate where is exposed through the groove 315 and the insulating film 311 (FIG. 9B). The conductive film 312 can be formed by using any method such as CVD, sputtering and screen printing, instead of a plating method.

Figure 9C:
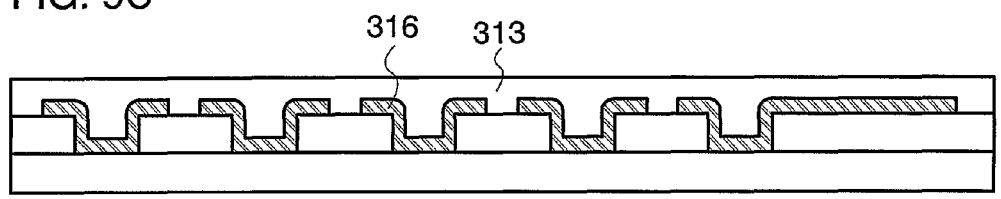

The conductive film 312 is selectively removed by etching or the like to form a conductive film 316, and then an insulating film 313 is formed to cover the conductive film 316 (FIG. 9C). The conductive film 316 is formed to cover the inside of the groove 315 and the edge of the insulating film 311 by partly removing the conductive film 312 provided on the insulating film 311.

Figure 9D:
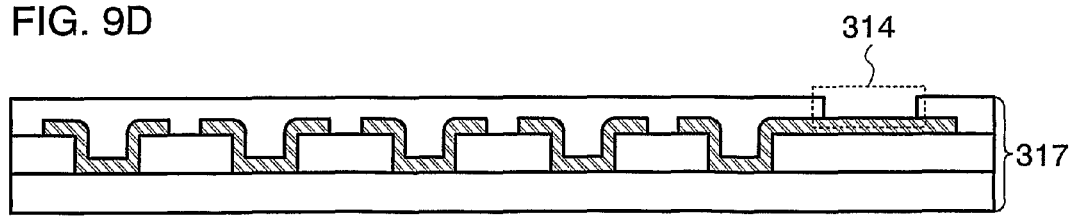

Next, an opening 314 is provided in the insulating film 313 (FIG. 9D). The opening 314 is provided by photolithography or by irradiating the insulating film 313 with laser beam. Alternatively, the insulating film 313 may be selectively formed except in a region in which the opening 314 will be formed by using a printing method such as screen printing and a droplet discharging method so as to form the opening 314.

Figure 7A:
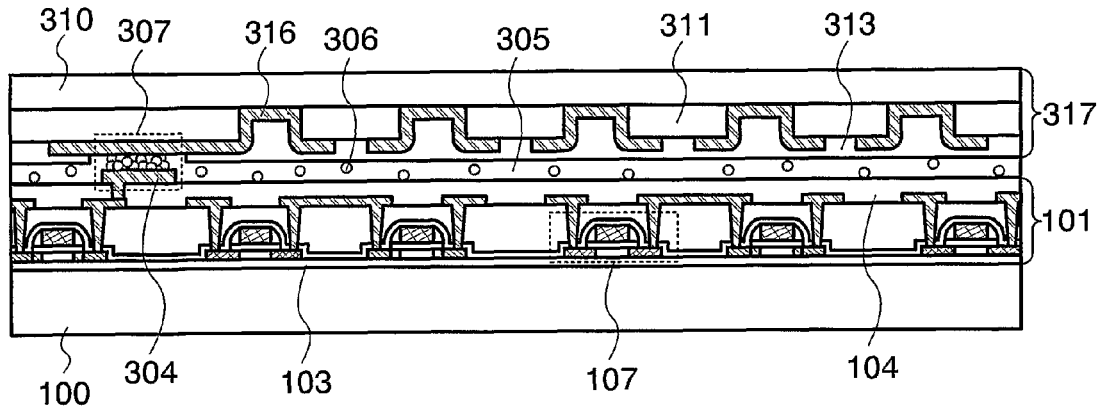
FIGS. 7A to 7C are cross sectional views showing structural examples of semiconductor device of the present invention.
Figure 7B:
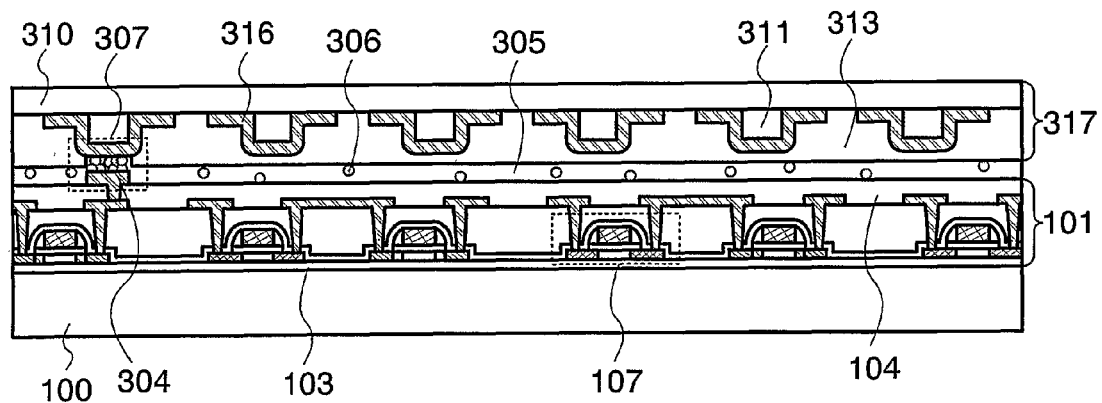
Figure 7C:
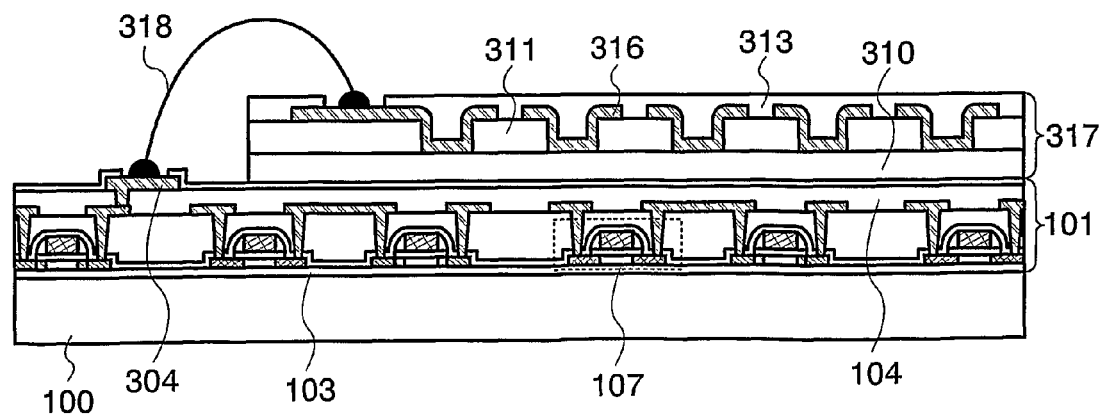

Through the above described processes, an antenna formation layer 317 can be obtained. Next, a case where an element formation layer and an antenna formation layer are attached to each other, will be described with reference to FIGS. 7A to 7C. FIGS. 7A to 7C show structural examples in a case where an element formation layer 101 and an antenna formation layer 317, which have been individually provided, are electrically connected to each other.

A semiconductor device as shown in FIG. 7A is formed by attaching the antenna formation layer 317, which is shown in FIG. 9D, to the element formation layer 101 with a resin 305 having an adhesion property. A conductive film 304, which is electrically connected to a source region or a drain region of a transistor 107, and the conductive film 312 serving as an antenna are electrically connected to each other through conductive microparticles 306 contained in the resin 305. An example in which the element formation layer and the antenna formation layer are electrically connected to each other using the conductive microparticles, is shown here. Alternatively, the element formation layer and the antenna formation layer can be connected to each other using a conductive adhesive agent such as a silver paste, a copper paste and a carbon paste, solder bonding, or the like.

A semiconductor device shown in FIG. 7B shows a case where the concave shape of the cross section of the conductive film 316 shown in FIG. 9D is changed to a convex shape. In a connection region 307, a surface of the convex shape of the conductive film 316 is electrically connected to the conductive film 304 through conductive microparticles 306. When the convex portion of the conductive film 316 provided in the connection region 307 is set higher than a convex portion of other conductive film 316, which is provided outside of the connection region 307, a gap between the surface of the convex portion of the conductive film 316 and the conductive film 304 can be reduced. Therefore, the element formation layer and the antenna formation layer can be connected to each other more surely when using the conductive microparticles 306. In this case, when manufacturing the antenna formation layer, a thickness of an insulating film 311 underlying the conductive film 316 provided in the connection region 307 is preferably set to be larger than a thickness of other insulating films 311 except in the connection region 307.

In a semiconductor device shown in FIG. 7C, an antenna formation layer 317 and an element formation layer 101 are electrically connected to each other by a wire bonding method using a wiring 318. In this case, the antenna formation layer 317 may be attached to a top surface of the element formation layer 101 by using an adhesive agent or the like as shown in FIG. 7C. Alternatively, the antenna formation layer 317 can be provided in the same layer as the element formation layer 101 or under the element formation layer.

The present embodiment mode can be implemented by being freely combined with the above described embodiment modes.

Embodiment Mode 4

A semiconductor device which is different from those of the above embodiment modes will be described in this embodiment mode with reference to the drawings. Specifically, a case where an element formation layer and an antenna formation layer are individually manufactured, and then the element formation layer and the antenna formation layer are connected to each other, will be described in a different manner from Embodiment Mode 3. Further, although a case of employing a coiled antenna is described in this embodiment mode, the other case of employing an antenna having a different shape from the coiled shape, can also be carried out in the same manner as this embodiment mode.

An element formation layer can be formed by using a manufacturing method described in FIGS. 4A to 4D. A method for manufacturing an antenna formation layer will be described below with reference to FIGS. 10A to 10E.

Figure 10A:
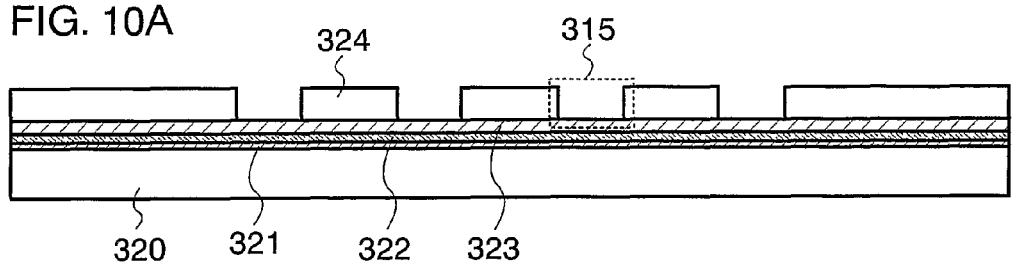
FIGS. 10A to 10E are cross sectional views showing an example of a method for manufacturing an antenna formation layer of a semiconductor device of the present invention.

An insulating film 321 serving as a base film is provided on a substrate 320, and a separation layer 322 and an insulating film 323 are laminated thereover. An insulating film 324 having a groove 315 is provided on the insulating film 323 (FIG. 10A).

Figure 10B:
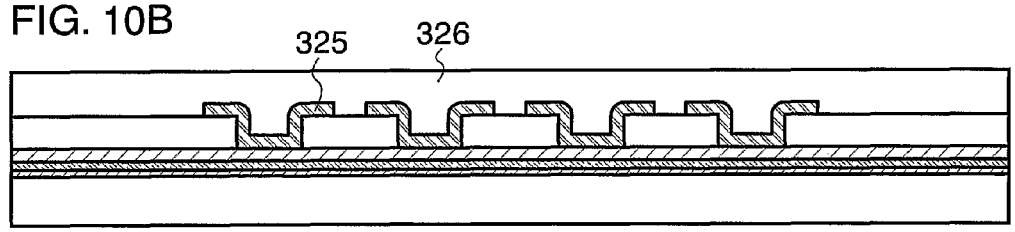

Next, by using the method shown in FIGS. 5A to 5C, a conductive film 325 is formed, and then an insulating film 326 is formed to cover the conductive film 325 (FIG. 10B).

Figure 10C:
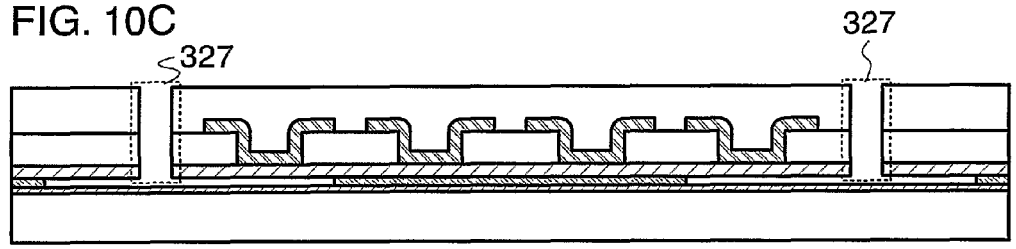

Subsequently, the separation layer 322 is exposed by selectively removing the insulating films 323, 324 and 326 to form openings 327. An etching agent is introduced into the openings 327 to remove the separation layer 322 (FIG. 10C).

Figure 10D:
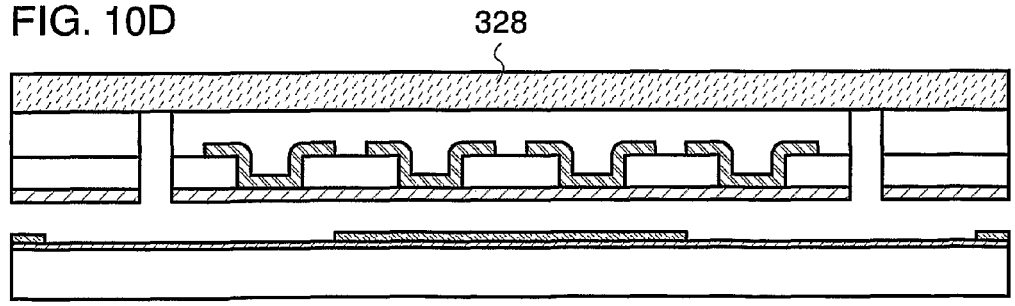

A flexible substrate 328 is attached to a surface of the insulating film 326, and then the substrate 320 is separated from the insulating film 323 (FIG. 10D).

Figure 10E:
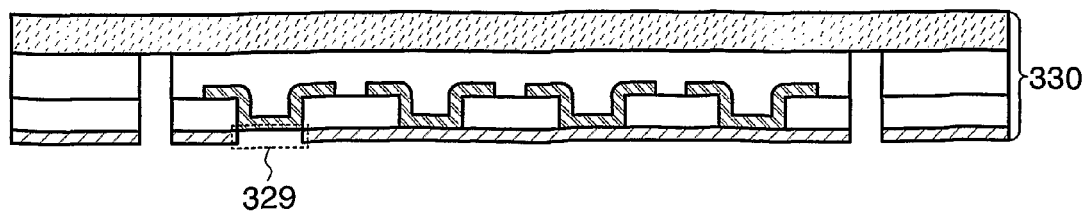

A part of the insulating film 323 is selectively removed by irradiation with laser beam or etching to form an opening 329 so as to expose the conductive film 325 therethrough (FIG. 10E).

The antenna formation layer can be formed through the above described processes. Unlike the manufacturing methods shown in FIGS. 4A to 4D, FIGS. 5A to 5D and FIGS. 6A and 6B, in the manufacturing method shown in FIGS. 10A to 10D, the antenna formation layer is provided over the separation layer, rather than the element formation layer. The materials and the like described in FIGS. 4A to 4D, FIGS. 5A to 5D and FIGS. 6A and 6B are applicable in FIGS. 10A to 10E.

Figure 8A:
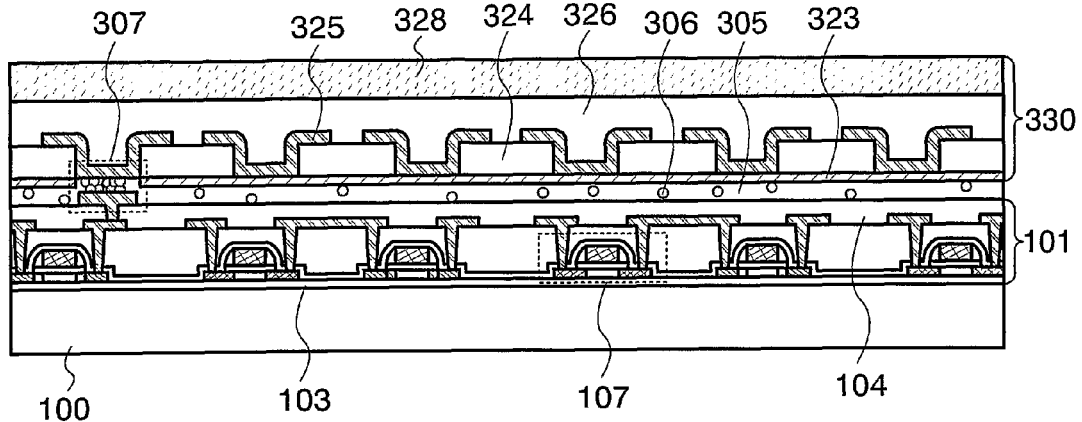
FIGS. 8A to 8C are cross sectional views showing structural examples of semiconductor devices of the present invention.
Figure 8B:
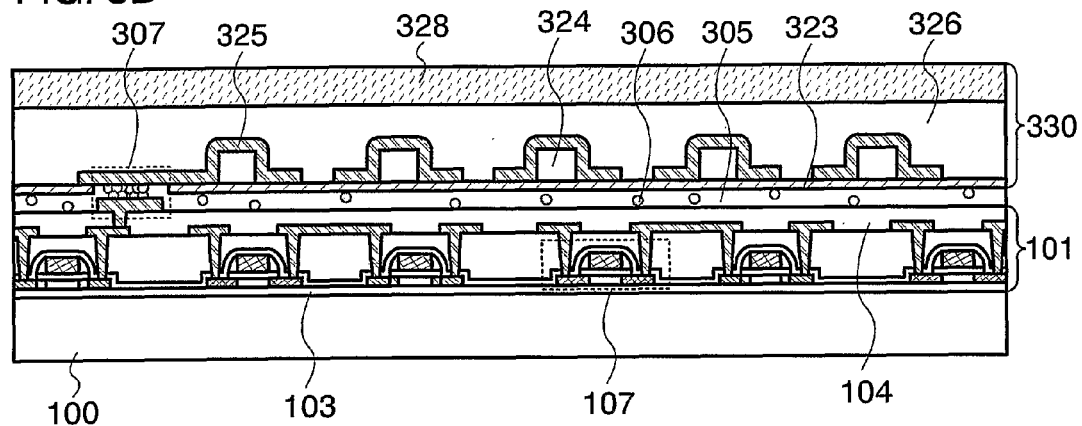
Figure 8C:
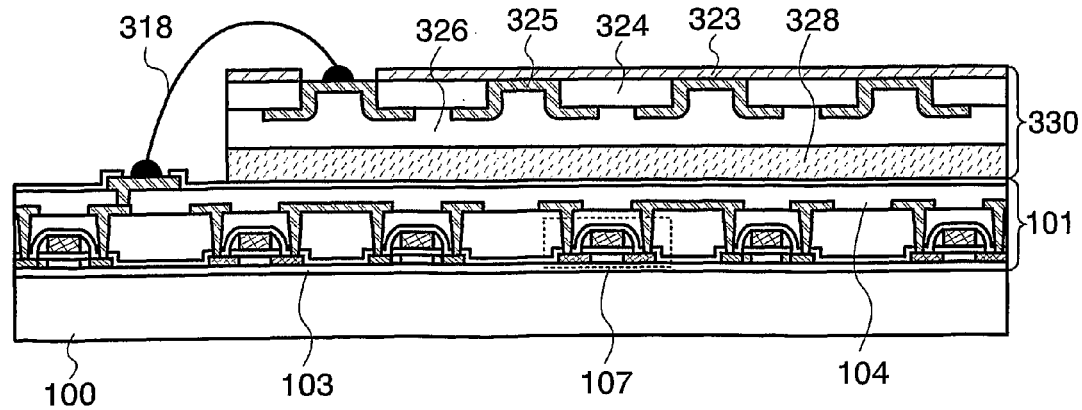

FIGS. 8A to 8C show structural examples in a case where an element formation layer 101 and an antenna formation layer 330, which have been individually formed in advance, are electrically connected to each other.

In a semiconductor device as shown in FIG. 8A, the antenna formation layer 330 shown in FIG. 10E is attached to an element formation layer 101 by using a resin 305 having an adhesion property. A conductive film 304, which is electrically connected to a source region or a drain region of a transistor 107, and a conductive film 325 serving as an antenna are electrically connected to each other through conductive microparticles 306 contained in the resin 305 in a connection region 307. An example in which the element formation layer and the antenna formation layer are electrically connected to each other using the conductive microparticles, is shown here. Alternatively, they can be electrically connected to each other using a conductive adhesive agent such as a silver paste, a copper paste and a carbon paste, solder bonding, or the like.

A semiconductor device shown in FIG. 8B shows a case where a cross section of the conductive film 316, which has a concave shape in FIG. 10D, is changed to have a convex shape. In a connection region 307, a surface of a convex shape of a conductive film 325 is electrically connected to the conductive film 304 through conductive microparticles 306.

In a semiconductor device shown in FIG. 8C, an antenna formation layer 317 and an element formation layer 101 are electrically connected to each other by a wire bonding method using a wiring 318. In this case, the antenna formation layer 317 may be attached to a top surface of the element formation layer 101 by using an adhesive agent or the like as shown in FIG. 7C. Alternatively, the antenna formation layer 317 can be provided in the same layer as the element formation layer 101 or under the element formation layer.

The method shown in this embodiment mode is especially effective in a case where a conductive film 325 serving as an antenna is difficult to be directly provided over a flexible substrate since a temperature of forming the conductive film 325 is high. That is, an antenna formation layer is first provided over a substrate that can withstand a processing temperature of a manufacturing process while interposing a separation layer between the antenna formation layer and the substrate, and the antenna formation layer is separated from the substrate, and then, the antenna formation layer can be provided over a flexible substrate.

The present embodiment mode can be implemented by being freely combined with the above described embodiment modes.

Embodiment Mode 5

In this embodiment mode, an example of a method for manufacturing a semiconductor device of the present invention will be described with reference to the drawings. Specifically, this embodiment mode shows an example of manufacturing a semiconductor device by using a thin film transistor (TFT) as a transistor of an element formation layer, by providing the element formation layer including the TFT over a supporting substrate, and then by separating the element formatting layer from the supporting substrate.

First, a separation layer 702 is formed on one surface of a substrate 701 (FIG. 11A). As the substrate 701, a glass substrate, a quartz substrate, a metal substrate, a stainless steel substrate on which an insulating film is provided, a plastic substrate having a heat resistance property, which can withstand a processing temperature of this process, or the like may be used. An area and a shape of the substrate 701 are not particularly limited so long as it is formed using the above mentioned materials. For example, when a rectangular substrate having 1 meter or more on a side is used as the substrate 701, the productivity can be significantly improved. This is a great advantage as compared to a case of using a circular silicon substrate. In this process, the separation layer 702 is provided on an entire surface of the substrate 701. Alternatively, after providing the separation layer on the entire surface of the substrate 701, the separation layer may be selectively etched by photolithography, if necessary. Further, the separation layer 702 is formed to be in contact with the substrate 701 here. Alternatively, an insulating film serving as a base film may be formed on the substrate 701, and then the separation layer 702 may be formed to be in contact with the insulating film.

The separation layer 702 is formed using a metal film and a metal oxide film. The metal film is formed in a single layer of a laminated layer of a film made from an element selected from tungsten (W), molybdenum (Mo), titanium (Ti), tantalum (Ta), niobium (Nd), nickel (Ni), cobalt (Co), zirconium (Zr), zinc (Zn), ruthenium (Ru), rhodium (Rh), lead (Pd), osmium (Os) and iridium (Ir); or an alloy material or a compound material mainly containing the above element, by a known method (such as sputtering and plasma CVD). The metal film is subjected to a plasma treatment under an oxygen atmosphere, or the metal film is subjected to a heat treatment under an oxygen atmosphere to form a metal oxide film the surface of on the metal film. Further, a metal oxynitride film may be used in addition to the metal oxide film.

For example, in the case of forming a metal film having a single layer structure, a tungsten layer, a molybdenum layer, or a layer containing a mixture of tungsten and molybdenum is formed. Then, a layer containing oxide or oxynitride of tungsten, a layer containing oxide or oxynitride of molybdenum, or a layer containing oxide or oxynitride of a mixture of tungsten and molybdenum is formed on the surface of the metal film. Further, the mixture of tungsten and molybdenum, for example, corresponds to an alloy of tungsten and molybdenum.

Alternatively, after forming the metal film on the substrate 701 as the separation layer 702, a metal oxide film may be formed by sputtering using a material of the metal film as a target under an oxygen atmosphere. In this case, the metal film and the metal oxide film can be independently formed using different metal elements. Further, a metal oxide film may be directly formed on the substrate 701 to be used as the separation layer 702.

Next, an insulating film 703, which serves a base film, is formed to cover the separation layer 702. The insulating film 703 is formed using a single layer of a film containing silicon oxide or silicon nitride, or a laminated layer thereof by a known method (such as sputtering and plasma CVD). When the insulating film serving as the base film, has a two layered structure, for example, a silicon nitride oxide film may be formed as a first layer, and a silicon oxynitride film may be formed as a second layer. When the insulating film serving as the base film, has a three layered structure, a silicon oxide film may be formed as a first insulating film, a silicon nitride oxide film may be formed as a second insulating film, and a silicon oxynitride film may be formed as a third insulating film. Alternatively, a silicon oxynitride film may be formed as a first insulating film, a silicon nitride oxide film may be formed as a second insulating film, and a silicon oxynitride film may be formed as a third insulating film. The insulating film serving as the base film also functions as a blocking film for preventing intrusion of an impurity through the substrate 701.

Then, an amorphous semiconductor film 704 (e.g., a film containing amorphous silicon) is formed on the insulating film 703. The amorphous semiconductor film 704 is formed to have a thickness of 25 to 200 nm (preferably, 30 to 150 nm) by a known method (such as sputtering, LPCVD, and plasma CVD). Subsequently, the amorphous semiconductor film 704 is crystallized by using a known crystallization method (such as laser crystallization, thermal crystallization using RTA or an annealing furnace, thermal crystallization using a metal element for promoting the crystallization, and a method with a combination of thermal crystallization using a metal element for promoting the crystallization and laser crystallization) so as to form a crystalline semiconductor film. Thereafter, the thus obtained crystalline semiconductor film is etched into a desired shape to form crystalline semiconductor films 706 to 710 (FIG. 11B). Further, the separation layer 702, the insulating film 703, and the amorphous semiconductor film 704 can be successively formed.

An example of a process of manufacturing the crystalline semiconductor films 706 to 710 will be briefly described below. First, an amorphous semiconductor film is formed to have a thickness of 66 nm by plasma CVD. After applying a solution containing nickel, which is a metal element for promoting the crystallization, to a surface of the amorphous semiconductor film, the amorphous semiconductor film is subjected to a dehydrogenation treatment (at 500° C. for one hour) and a thermal crystallization treatment (at 550° C. for 4 hours) to form a crystalline semiconductor film. Afterwards, the crystalline semiconductor film is irradiated with laser beam, if necessary, and then each of the crystalline semiconductor films 706 to 710 is formed by photolithography.

When forming a crystalline semiconductor film by laser crystallization, a continuous wave or pulsed oscillation gas laser or solid laser is used. As the gas laser, an excimer laser, a YAG laser, a YVO$_4$ laser, a YLF laser, a YAlO$_3$ laser, a glass laser, a ruby laser, a Ti: sapphire laser, or the like is used. As the solid laser, a laser using a crystal such as YAQ YVO$_4$, YLF, and YAlO$_3$ to which Cr, Nd, Er, Ho, Ce, Co, Ti or Tm is doped, is used. In particular, by irradiating an amorphous semiconductor film with a fundamental wave of a continuous wave laser and a second harmonic to a fourth harmonic of the fundamental wave, a large grain crystal can be obtained. For example, a second harmonic (532 nm) or a third harmonic (355 nm) of an Nd:YVO$_4$ laser (fundamental wave: 1,064 nm) can be used. Further, an amorphous semiconductor film may be irradiated with both a continuous wave laser beam of a fundamental wave and a continuous wave laser beam of a harmonic. Alternatively, the amorphous semiconductor film may be irradiated with both a continuous wave laser beam of a fundamental wave and a pulsed laser beam of a harmonic. Energy can be supplemented by irradiating with plural kinds of laser beams. In the case of the pulsed laser, a pulsed laser may be oscillated with such a repetition rate that the laser of the next pulse is emitted before solidifying the semiconductor film that has been melted. This makes it possible to obtain crystal grains which are continuously grown in the scanning direction. In other words, it is possible to use a pulsed oscillation laser of which a lower limit of a repetition rate is set shorter than the time required for the melted semiconductor film to solidify. Pulsed oscillation laser beam of which a repetition rate is 10 MHz or more may be used as such a laser.

When an amorphous semiconductor film is crystallized by using a metal element for promoting the crystallization, there are advantages that the amorphous semiconductor film can be crystallized at a low temperature for short times, and the directions of crystals are aligned. However, in this case, there are also disadvantages that an off current is increased since the metal element remains in the crystalline semiconductor film, and a characteristic is not stable. In order to solve the problems, an amorphous semiconductor film serving as a gettering site is preferably formed on a crystalline semiconductor film. Since the amorphous semiconductor film serving as the gettering site, is required to contain an impurity element such as phosphorus and argon, the amorphous semiconductor film is preferably formed by sputtering by which argon can be applied to the amorphous semiconductor film at a high concentration. Thereafter, a heat treatment (thermal annealing using RTA or an annealing furnace, or the like) is carried out to disperse a metal element in an amorphous semiconductor film, and then the amorphous semiconductor film containing the metal element is removed. Thus, the content of the metal element in the crystalline semiconductor film can be reduced or the metal element can be removed.

Next, a gate insulting film 705 is formed to cover the crystalline semiconductor films 706 to 710. The gate insulating film 705 is formed in a single layer or a laminated layer of a film containing silicon oxide or silicon nitride by a known method (such as plasma CVD and sputtering). Specifically, a single layer or a laminated layer of a film containing silicon oxide, a film containing silicon oxynitride, and a film containing silicon nitride oxide is formed as the gate insulating film.

A first conductive film is formed on the gate insulating film 705 and a second conductive film is laminated on the first conductive film. The first conductive film is formed to have a thickness of 20 to 100 nm by a known method (plasma CVD or sputtering). The second conductive film is formed to have a thickness of 100 to 400 nm by a known method. The first and second conductive films are formed by using an element selected from tantalum (Ta), tungsten (W), titanium (Ti), molybdenum (Mo), aluminum (Al), copper (Cu), chromium (Cr), niobium (Nd) and the like; or an alloy material or a compound material mainly containing these elements. Alternatively, they are formed by using a semiconductor material typified by polysilicon doped with an impurity element such as phosphorus. As examples of the combination of the first and second conductive films, a combination of a tantalum nitride (TaN) film and a tungsten (W) film, a combination of a tungsten nitride (WN) film and a tungsten film, a combination of a molybdenum nitride (MoN) film and a molybdenum (Mo) film, and the like can be given. Since tungsten and tantalum nitride have high heat resistance properties, after forming the first and second conductive films by using the tungsten and tantalum nitride, a heat treatment for thermal activation can be carried out. Further, in the case of a three layered structure rather than the two layered structure, a laminated structure of a molybdenum film, an aluminum film and another molybdenum film is preferably employed.

Next, a mask is formed using a resist by photolithography. An etching treatment for forming gate electrodes and gate wirings is performed to form conductive films (also, sometimes referred to as gate electrodes) 716 to 725 serving as gate electrodes.

Subsequently, a mask is formed using a resist by photolithography. While utilizing the mask, an impurity element imparting an N-type conductivity is added to the crystalline semiconductor films 706, 708, 709 and 710 by ion-doping or ion-implantation at a low concentration so as to form N-type impurity regions 711, 713, 714, and 715 and channel formation regions 780, 782, 783 and 784. As the impurity element imparting the N-type conductivity, an element belonging to the 15 group of the periodic table may be used, and for example, phosphorus (P) or arsenic (As) is used.

Next, a mask is formed using a resist by photolithography. While utilizing the mask, an impurity element imparting a P-type conductivity is added to the crystalline semiconductor film 707 to form a P-type impurity region 712 and a channel formation region 781. As the impurity element imparting the P-type conductivity, for example, boron (B) is used.

An insulating film is formed to cover the gate insulating film 705 and the conductive films 716 to 725. The insulating film is formed to include a single layer or a laminated layer by using a film containing an inorganic material such as silicon, silicon oxide and silicon nitride, or a film containing an organic material such as an organic resin. Next, the insulating film is selectively etched mainly in a perpendicular direction by anisotropic etching to form insulating films (also referred to as sidewalls) 739 to 743 being in contact with the side surfaces of the conductive films 716 to 725 (FIG. 11C). Further, the insulating film 705 is etched to form insulating films 734 to 738 while forming the insulating films 739 to 743. The insulating films 739 to 743 can be used as masks for doping when forming LDD (lightly doped drain) regions later.

Next, by using a mask made from a resist, which is formed by photolithography, and by utilizing the insulating films 739 to 743 as masks, an impurity element imparting an N-type conductivity is added to the crystalline semiconductor films 706, 708, 709, and 710 to form first N-type impurity regions (also referred to as LDD regions) 727, 729, 731 and 733 and second N-type impurity regions 726, 728, 730 and 732. The concentration of the impurity element contained in the first N-type impurity regions 727, 729, 731 and 733 is lower than that of the second N-type impurity regions 726, 728, 730 and 732. Through the above described process, N-type thin film transistors 744, 746, 747 and 748 and a P-type thin film transistor 745 are completed.

When forming the LDD regions, the insulating layers, which are also referred to as the sidewalls, are preferably used as the masks. By using the technique utilizing the insulating layers (or the sidewalls) as the masks, the width of each LDD region can be easily controlled and the LDD regions can be formed certainly.

Subsequently, an insulating film including a single layer of a laminated layer is formed to cover the N-type thin film transistors 744, 746, 747 and 748 and the P-type thin film transistor 745 (FIG. 12A). The insulating film covering the N-type thin film transistors 744, 746, 747 and 748 and the P-type thin film transistor 745, is formed in a single layer or a laminated layer of an inorganic material such as silicon oxide and silicon nitride, an organic material such as polyimide, polyamide, benzocyclobutene, acrylic, epoxy and siloxane, or the like by a known method (e.g., an SOG technique, a droplet discharging method or the like). A siloxane material, for example, is a substance having a skeleton structure using silicon and oxygen bonds and containing at least hydrogen in a substituent, or a substance having a skeleton structure formed by silicon and oxygen bonds and containing at least one of fluorine, an alkyl group, and aromatic hydrocarbon in a substituent. For instance, when the insulating film covering the N-type thin film transistors 744, 746, 747 and 748 and the P-type thin film transistor 745, has a three layered structure, a film containing silicon oxide is formed as a first insulating film 749, a film containing a resin is formed as a second insulating film 750, and a film containing silicon nitride is formed as a third insulating film 751.

Further, in order to recover the crystallinity of the semiconductor films, activate the impurity element added to the semiconductor films, or hydrogenate the semiconductor films, a heat treatment is preferably carried out prior to forming the insulating films 749 to 751 or after forming one or more of the insulating films 749 to 751. The heat treatment is preferably performed by thermal annealing, laser annealing, RTA, or the like.

Next, the insulating films 749 to 751 are etched by photolithography to form contact holes through which the N-type impurity regions 726, 728, 729, 730, 731 and 732 and the P-type impurity region 785 are exposed. Subsequently, a conductive film is formed to fill the contact holes, and then the conductive film is patterned to form conductive films 752, 753, 754, 755, 756, 757, 758, 759, 760 and 761, which serve as source wirings or drain wirings.

The conductive films 752 to 761 are formed in a single layer or a laminated layer using an element selected from titanium (Ti), aluminum (Al) and neodymium (Nd), or an alloy material or a compound material mainly containing these elements, by a known method (e.g., plasma CVD, sputtering, or the like). An alloy material mainly containing aluminum is, for example, a material mainly including aluminum, which also contains nickel, or an alloy material mainly including aluminum, which also contains one or both of carbon and silicon. Each of the conductive films 752 to 761 may include, for example, a structure formed by laminating a barrier film, an aluminum-silicon (Al—Si) film and a barrier film, or a structure formed by laminating a barrier film, aluminum-silicon (Al—Si) film, a titanium nitride (TiN) film and a barrier film. Further, the barrier film corresponds to a thin film including titanium, titanium nitride, molybdenum, or molybdenum nitride. Since aluminum and aluminum-silicon have low resistivity and are less expensive, they are preferable as materials for the conductive films 752 to 761. Further, when barrier layers are provided as an upper layer and a lower layer, generation of hillocks in aluminum or aluminum-silicon can be prevented. Furthermore, when a barrier film is formed using titanium, which is an element having a high reducing property, even when a thin oxide film is naturally formed on a crystalline semiconductor film, the naturally-formed thin oxide film can be reduced so that the barrier film can be favorably contacted to the crystalline semiconductor film.

Next, an insulating film 762 is formed to cover the conductive films 752 to 761 (FIG. 12B). The insulating film 762 is formed using a single layer of a laminated layer of an inorganic material or an organic material by a known method (e.g., an SOG technique, a droplet discharging method, or the like). The insulating film 762 is preferably formed to have a thickness of 0.75 to 3 μm.

Subsequently, the insulating film 762 is etched by photolithography to form contact holes through which the conductive films 757, 759 and 761 are exposed. Then, a conductive film is formed to fill the contact holes. The conductive film is formed using a conductive material by a known method (e.g., plasma CVD, sputtering, or the like). The conductive film is patterned to form conductive films 763 to 765. Further, each of the conductive films 763 to 765 becomes one of a pair of conductive films included in a memory element. Therefore, each of the conductive films 763 to 765 is preferably formed in a single layer or a laminated layer, using titanium, or an alloy material or a compound material mainly containing titanium. Since titanium has low resistivity, the size of a memory element can be reduced, thereby realizing high integration. In the photolithography performed to form the conductive films 763 to 765, wet etching is preferably performed and hydrogen fluoride (HF) or ammonia-hydrogen peroxide mixture is preferably used as an etching agent so as not to damage the thin film transistors 744 to 748 underlying the conductive films 763 to 765.

Next, an insulating film 766 is formed to cover the conductive films 763 to 765. The insulating film 766 is formed in a single layer or a laminated layer using an inorganic material or an organic material by using a known method (such as an SOG technique and a droplet discharging method). The insulating film 762 is preferably formed to have a thickness of 0.75 to 3 μm. Subsequently, the insulating film 766 is etched by photolithography to form contact holes 767 to 769 through which the conductive films 763 to 765 are exposed.

Figure 13A:
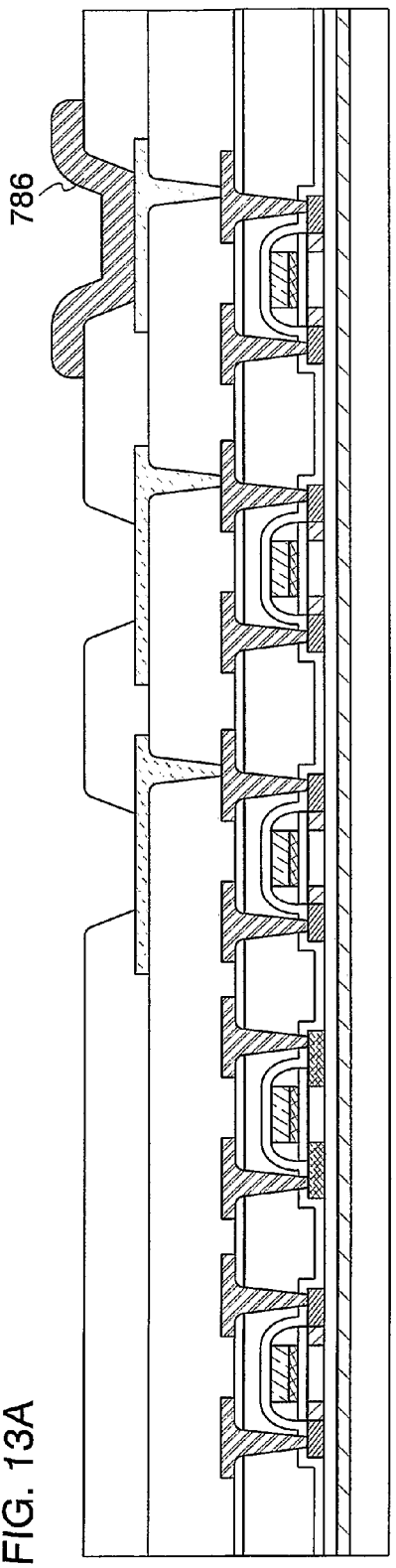
FIGS. 13A and 13B are cross sectional views showing an example of a method for manufacturing a semiconductor device of the present invention.

A conductive film 786 serving as an antenna is formed to be in contact with the conductive film 765 (FIG. 13A). The conductive film 786 is formed using a conductive material by a known method (e.g., plasma CVD, sputtering, printing, a droplet discharging method, or the like). Preferably, the conductive film 786 is formed in a single layer or a laminated layer of an element selected from aluminum (Al), titanium (Ti), silver (Ag), and copper (Cu), or an alloy material or a compound material mainly containing these elements. The conductive film 786 is formed using a paste containing silver by screen printing, and then is subjected to a heat treatment at 50 to 350° C. here. Alternatively, an aluminum film is formed by sputtering, and then the aluminum film is patterned to form the conductive film 786. As the patterning processing of the aluminum film, wet etching is preferably used. After the wet etching, a heat treatment is preferably carried out at 200 to 300° C. Further, the conductive film 786 is formed to have any one of the shapes described in Embodiment Mode 1.

Figure 13B:
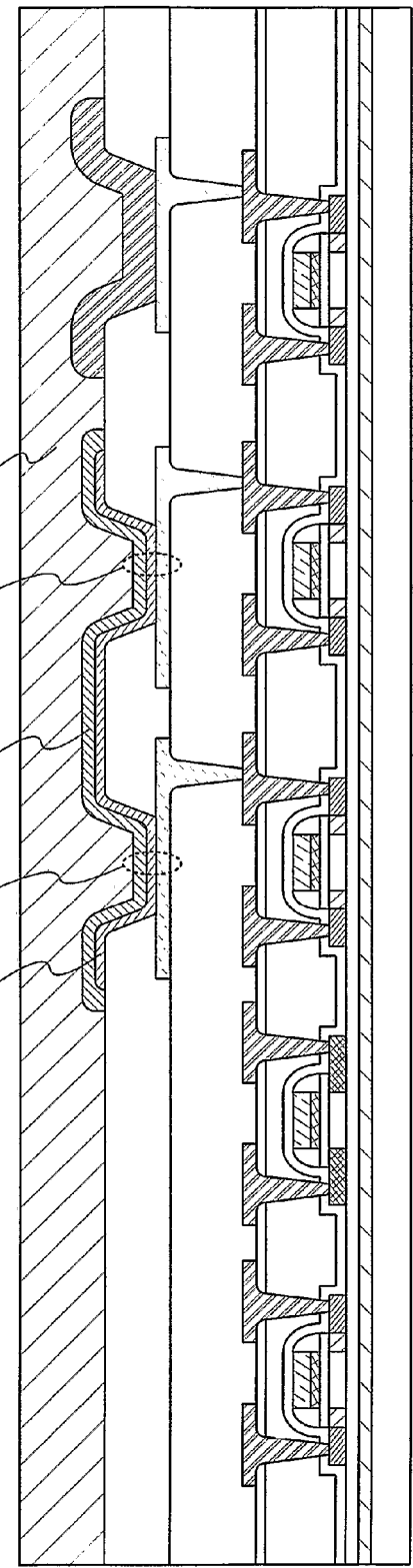

Next, an organic compound layer 787 is formed to be in contact with the conductive films 763 and 764 (FIG. 13B). The organic compound layer 787 is formed by a known method (e.g., a droplet discharging method, evaporation, or the like). Then, a conductive film 771 is formed to be in contact with the organic compound layer 787. The conductive film 771 is formed by a known method (e.g., sputtering, evaporation, or the like).

Through the above mentioned process, a memory element portion 789 including a laminated body of the conductive film 763, the organic compound layer 787 and the conductive film 771, and a memory element portion 790 including a laminated body of the conductive film 764, the organic compound layer 787 and the conductive film 771 are completed.

Furthermore, since the organic compound layer 787 does not have a strong heat resistance property, one feature of the above mentioned manufacturing process is that the step of forming the organic compound layer 787 is carried out after the step of forming the conductive film 786 serving as the antenna. Also, the conductive film 786 serving as the antenna can be provided in the same layer as the conductive films 716 to 725, the same layer as the conductive films 752 to 761, the same layer as the conductive films 763 to 765, or the same layer as the conductive film 771. Moreover, an antenna can also be provided as follows: a conductive film, which is separately provided over a substrate, and the conductive film 765 are attached to each other using an adhesive agent containing a conductive microparticle and the like, rather than forming the conductive film 786 serving as the antenna directly over an object substrate. In this case, an antenna can be formed even after forming the organic compound layer 787.

Further, an example of using an organic compound material as the memory element portions 789 and 790 is shown here, however, the present invention is not limited thereto. For example, a phase change material such as a material, which is reversibly changed between a crystal state and an amorphous state, and a material, which is reversibly changed between a first crystal state and a second crystal state, can be used. Further, a material, which is changed only to a crystal state from an amorphous sate, can be used.

The material, which is reversibly changed between the crystal state and the amorphous state, is a material having plural elements selected from germanium (Ge), tellurium (Te), antimony (Sb), sulfur (S), tellurium oxide (TeOx), tin (Sn), gold (Au), gallium (Ga), selenium (Se), indium (In), thallium (Ti), cobalt (Co), and silver (Ag). For example, a Ge—Te—Sb—S material, a Te—TeO$_2$—Ge—Sn material, a Te—Ge—Sn—Au material, a Ge—Te—Sn material, an Sn—Se—Te material, an Sb—Se—Te material, an Sb—Se material, a Ga—Se—Te material, a Ga—Se—Te—Ge material, an In—Se material, an In—Se—Ti—Co material, a Ge—Sb—Te material, an In—Se—Te material, and an Ag—In—Sb—Te material can be given. Also, the material, which is reversibly changed between the first crystal state and the second crystal state, is a material having plural elements selected from silver (Ag), zinc (Zn), copper (Cu), aluminum (Al), nickel (Ni), indium (In), antimony (Sb), selenium (Se) and tellurium (Te). For example, Te—TeO$_2$, Te—TeO$_2$—Pd, and Sb$_2$Se$_3$/Bi$_2$Te$_3$ can be given. In the case of the material, which is reversibly changed between the first crystal state and the second crystal state, the phase is changed between two different crystal states. The material, which is changed only to the crystal state from the amorphous state, is a material having plural elements selected from tellurium (Te), tellurium oxide (TeOx), antimony (Sb), selenium (Se) and bismuth (Bi). For example, Ag—Zn, Cu—Al—Ni, In—Sb, In—Sb—Se, and In—Sb—Te can be given.

Next, an insulating film 772 serving as a protection film is formed by a known method (such as an SOG technique and a droplet discharging method) so as to cover the memory element portions 789 and 790, and the conductive film 786 serving as the antenna. The insulating film 772 is formed using a film containing carbon such as DLC (diamond like carbon), a film containing silicon nitride, a film containing silicon nitride oxide, an organic material, or the like. Preferably, the insulating film 722 is formed using an epoxy resin.

Figure 14A:
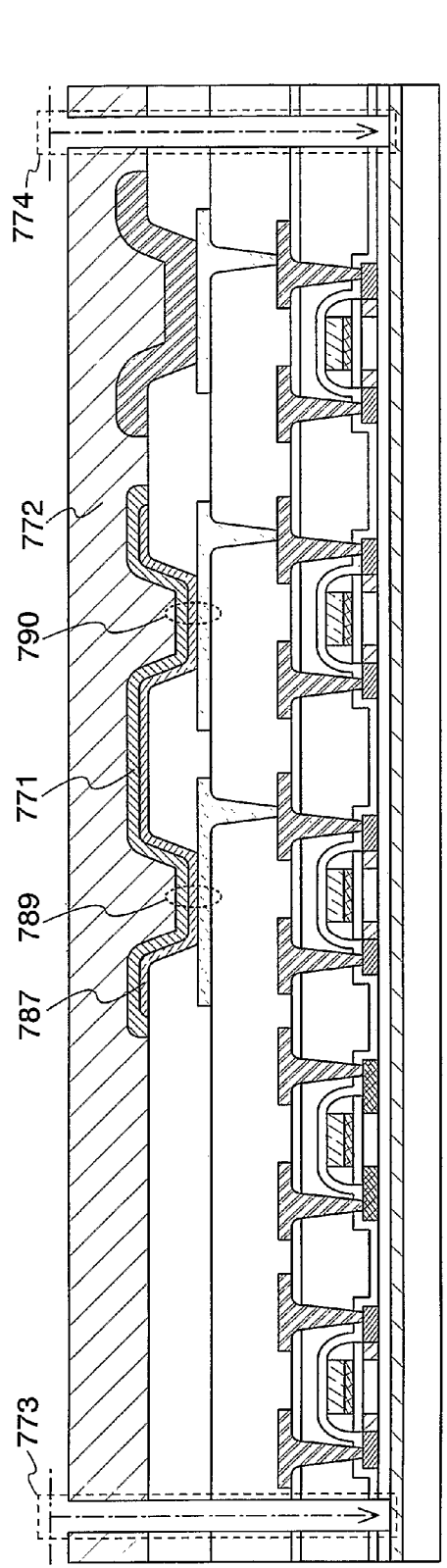
FIGS. 14A and 14B are cross sectional views showing an example of a method for manufacturing a semiconductor device of the present invention.

Next, the insulating film is etched by photolithography or by being irradiated with laser beam to form an opening 773 and an opening 774 such that the separation layer 702 is exposed therethrough (FIG. 14A).

Figure 14B:
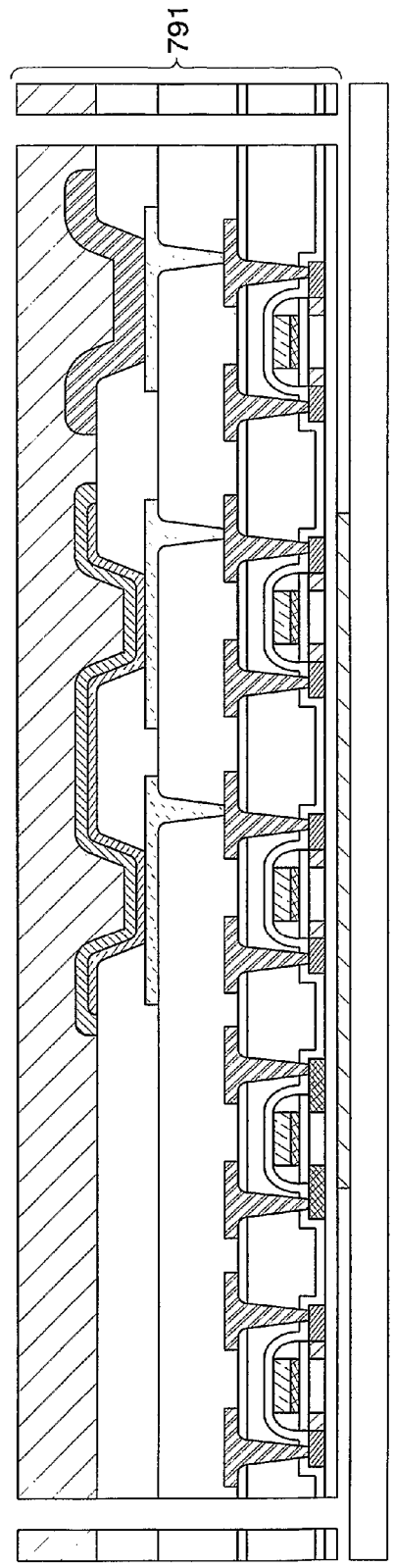

An etching agent is introduced into the openings 773 and 774 to remove the separation layer 702 (FIG. 14B). As the etching agent, a gas or a liquid containing halogen fluoride or an interhalogen compound is used. For example, chlorine trifluoride (ClF$_3$) is used as a gas containing halogen fluoride. Thus, an element layer 791 is separated from the substrate 701. Further, the element layer 791 herein includes the thin film transistors 744 to 748, an element group of the memory element portions 789 and 790, and the conductive film 786 serving as the antenna. Moreover, the separation layer 702 may not be removed entirely, and a part of the separation layer may remain on the substrate 701. This allows to reduce a consumption amount of the etching agent and shorten the processing time that is required for removing the separation layer. In addition, after removing the separation layer 702, the element layer 791 can be fixed to the substrate 701.

The substrate 701 from which the element layer 791 is separated is preferably reused to reduce the cost. Also, the insulating film 772 is formed so as not to scatter element layers 791 after removing the separation layer 702. Since the element layer 791 is small, thin and lightweight, after removing the separation layer 702, the element layer 791 is easily scattered. However, by forming the insulating film 772 on the element layer 791, the element layer 791 is adhered to the insulating film 772, thereby preventing the element layer 791 from scattering. Although the element layer 791 itself is thin and lightweight, by forming the insulating film 772, the element layer 791 separated from the substrate 701 is not rolled up due to stress or the like, and hence, a certain degree of strength can be secured.

Further, an example of removing the separation layer 702 by using the etching agent is shown here, however, the separation layer 702 is not necessarily separated by using the etching agent. That is, when the element layer 791 is not well-adhered to the separation layer 702 after forming the openings 773 and 774, the element layer 791 can be separated from the substrate 701 by using a physical means. In this case, since the etching agent is not required, the process can be shortened and the cost can be reduced.

Next, one surface of the element layer 791 is attached to a first sheet material 775 and the element layer 791 is completely separated from the substrate 701 (FIG. 15A). In the case where a part of the separation layer 702 is left rather than removing the separation layer completely, the element layer is separated from the substrate 701 by using a physical means. Subsequently, a second sheet material 776 is formed on the other surface of the element layer 791, and attached thereto by performing one or both of a heat treatment and a pressing treatment. Also, while providing the second sheet material 776, or after providing the second sheet material 776, the first sheet material 775 is separated, and a third sheet material 777 is provided on the surface of the element layer 791 as a substitute for the first sheet material. Thereafter, one or both of a heat treatment and a pressing treatment is/are carried out to attach the third sheet material 777 to the element layer 791. Thus, a semiconductor device, which is sealed with the second sheet material 776 and the third sheet material 777, can be completed (FIG. 15B).

Alternatively, the semiconductor device may be sealed with the first sheet material 775 and the second sheet material 776. When a sheet material used for separating the element layer 791 from the substrate 701 and a sheet material used for sealing the element layer 791 are different from each other, the element layer 791 is sealed with the second sheet material 776 and the third sheet material 777 as described above. This is effective in the case where, for example, when the element layer 791 is separated from the substrate 701, the first sheet material 775 is attached not only to the element layer 791 but also to the substrate 701, or in the case where a sheet material having weak adhesion is used.

As the second sheet material 776 and the third sheet material 777 used for sealing the element layer 791, a film made from polypropylene, polyester, vinyl, polyvinyl fluoride, vinyl chloride, or the like, a paper formed using a fibrous material, a laminated film of a base material film (e.g., polyester, polyamide, an inorganic evaporation film, a paper, or the like) and an adhesive synthetic resin film (e.g., an acrylic synthetic resin, an epoxy synthetic resin, or the like), and the like can be used. Further, a film is attached to an object matter by thermocompression while performing a heat treatment and a pressing treatment. When performing the heat treatment and the pressing treatment, an adhesive layer provided on a top surface of the film, or a layer provided at a top layer of the film (which is not an adhesive layer) is melted by the heat treatment, and then the melted layer is attached to an object matter by the pressing treatment. Further, each surface of the second sheet material 776 and the third sheet material 777 may be provided with an adhesive layer or may not be provided with an adhesive layer. The adhesive layer corresponds to a layer containing an adhesive agent such as a thermosetting resin, an ultraviolet curing resin, an epoxy resin adhesive agent, and a resin additive agent. Also, a sheet material used for sealing the element layer to prevent the intrusion of moisture and the like into an interior of the element layer, is preferably coated with silica. For example, a sheet material over which an adhesive layer, a film such as polyester, and a silica coat are laminated can be used.

Furthermore, films that are subjected to an antistatic treatment for preventing static charge and the like (hereinafter, referred to as antistatic films) can be used as the second sheet material 776 and the third sheet material 777. A film in that an antistatic material is dispersed in a resin, a film to which an antistatic material is attached, and the like can be given as the antistatic films. With respect to a film to which an antistatic material is attached, the antistatic material may be provided to one surface of the film, or the antistatic material may be provided to both surfaces of the film. Further, the film having an antistatic material on one side may be adhered to an object matter such that the antistatic material is in contact with the object matter, or, the other surface of the film is in contact with the object matter. Furthermore, the antistatic material may be provided on an entire surface of a film, or a part of a film. As the antistatic material, metal, indium tin oxide (ITO), surfactant such as ampholytic surfactant, cationic surfactant and nonionic surfactant, or the like can be used. In addition, a resin material containing cross-linked copolymer that has a carboxyl group and a quaternary ammonium group in side chains, and the like can be used as the antistatic material. By attaching or applying these materials to a film, or by mixing them in a film, the film can be used as an antistatic film. By sealing the element formation layers with the antistatic films, semiconductor elements can be prevented from being adversely affected by static charge and the like from an external portion when dealing the semiconductor devices as products.

Moreover, the present embodiment mode can be implemented by being freely combined with the above mentioned embodiment modes.

Embodiment Mode 6

A case of using a semiconductor device of the present invention as an RFID, which can transmit and receive data without contact, will be described with reference to FIGS. 17A to 17C.

Figure 17A:
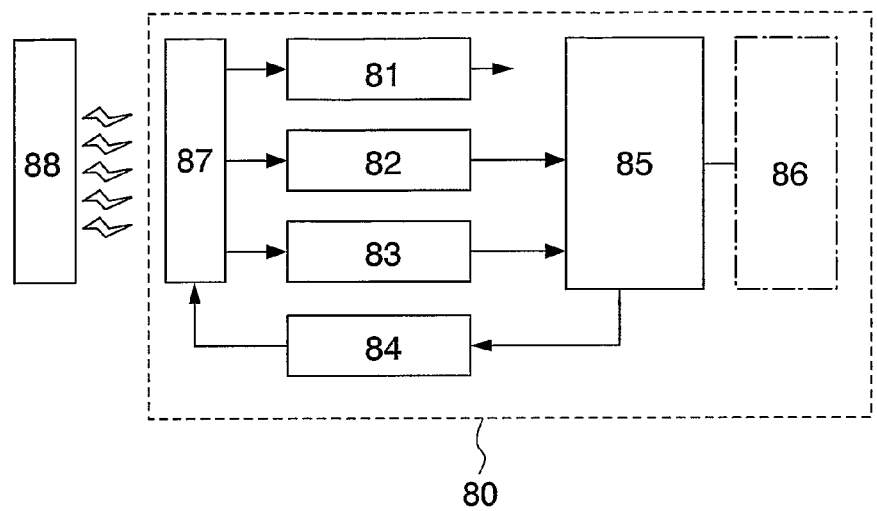
FIGS. 17A to 17C are diagrams showing use modes of semiconductor devices of the present invention.
Figure 17B:
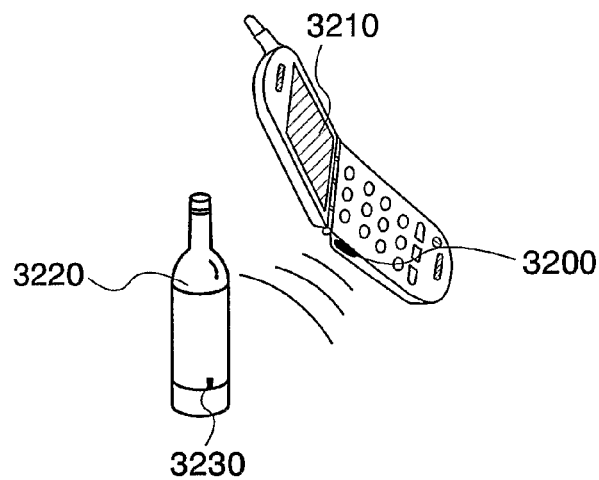
Figure 17C:
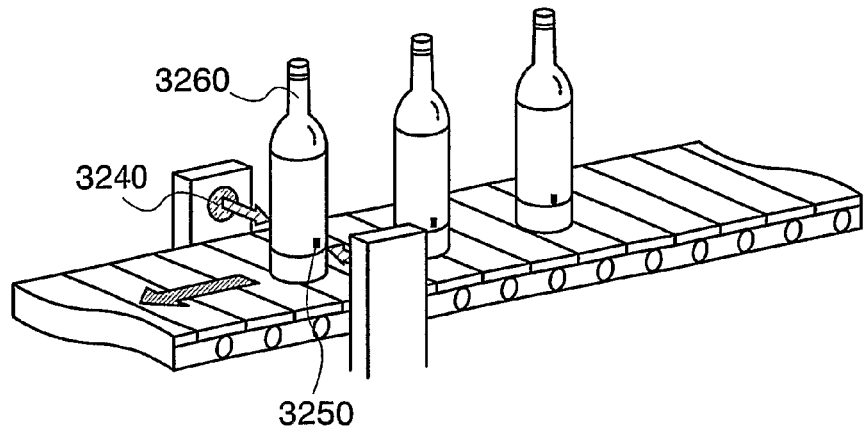
Figure 18A:
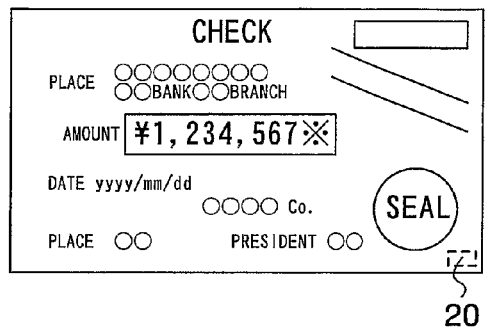
FIGS. 18A to 18H are diagrams showing use modes of semiconductor devices of the present invention.
Figure 18B:
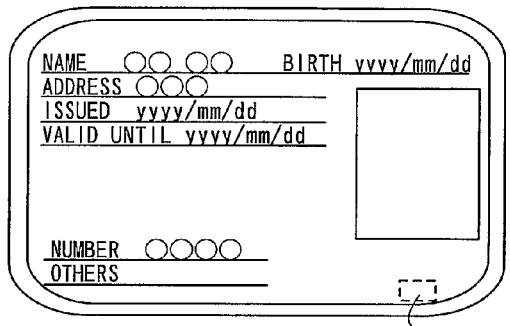
Figure 18C:
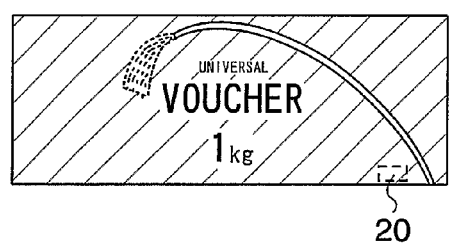
Figure 18D:
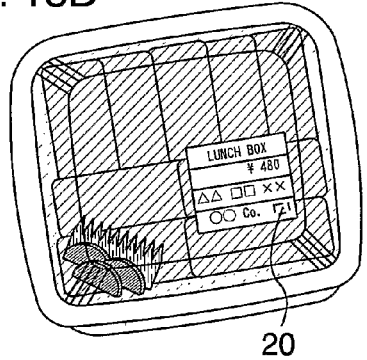
Figure 18E:
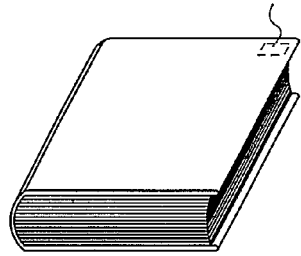
Figure 18F:
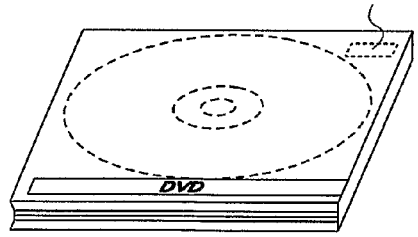
Figure 18G:
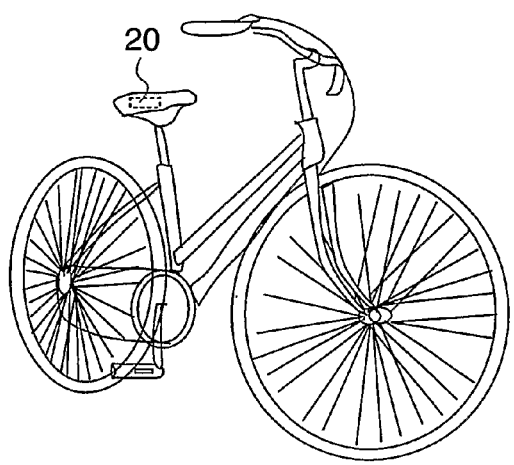
Figure 18H:
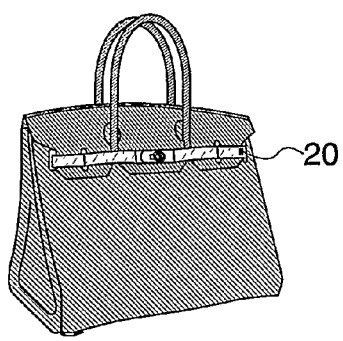

An RFID 80 has a function of exchanging data without contact, and includes a power supply circuit 81, a clock generation circuit 82, a data demodulation circuit 83, a data modulation circuit 84, a control circuit 85 for controlling other circuits, a memory circuit 86, and an antenna 87 (FIG. 17A). Further, the RFID may includes plural memory circuits, rather than one memory circuit. An SRAM, a flash memory, a ROM, a FeRAM, a circuit, which uses an organic compound layer shown in the above described embodiment modes in a memory element portion, and the like can be used.

Signals sent from a reader/writer 88 as radio waves are modulated into alternating-current electric signals in the antenna 87 by electromagnetic induction. A power supply voltage is generated in the power supply circuit 81 by using the alternating-current electric signals, and supplied to each circuit using a power supply line. The clock generation circuit 82 generates various kinds clock signals based on the alternating-current electric signals, which are input from the antenna 87, and supplies the various kinds of clock signals to the control signal 85. The modulation circuit 83 demodulates the alternating-current electric signals and supplies the demodulated alternating-current electric signals to the control circuit 85. In the control circuit 85, various kinds of arithmetic processings are performed in accordance with the input signals. Programs, data and the like that are used in the control circuit 85 are stored in the memory circuit 86. In addition, the memory circuit 86 can also be used as a work area in the arithmetic processings. Then, data is transmitted to the modulation circuit 84 from the control circuit 85, and load modulation can be added to the antenna 87 from the modulation circuit 84 in accordance with the data. Consequently, the reader/writer 88 receives load modulation applied to the antenna 87 via radio waves so that the reader/writer can read the data.

Furthermore, the RFID may be of a type in that the power supply voltage is supplied to each circuit via radio waves without having a power source (a buttery), or another type in that the power supply voltage is supplied to each circuit by utilizing both radio waves and a power source (a buttery).

When using a semiconductor device of the present invention as an RFID or the like, there are advantages, wherein communication is performed without contact, plural pieces of data can be read, data can be written in the RFID, the RFID can be processed into various shapes, the RFID has a wide directional characteristic and a wide recognition range depending on a frequency to be selected, and the like. The RFID can be applied to an IC tag that can recognize individual information about a person and goods by radio communication without contact, a label that can be attached to an object by performing a labeling treatment, a wristband for an event or an amusement, or the like. Also, the RFID may be processed by using a resin material. Alternatively, the RFID may be directly fixed to metal that hinder wireless communication. Moreover, the RFID can be utilized for system administration such as a room security management system and an account system.

Next, an example of actually using the above described semiconductor device as an RFID will be described. A reader/writer 3200 is provided on a side surface of a portable terminal that includes a display portion 3210. An RFID 3230 is provided on a side surface of a product 3220 (FIG. 17B). When holding the reader/writer 3200 over the RFID 3230 included in the product 3220, information about the product such as a raw material, a place of origin, test results in each production process, history of distribution process, and a description of a commodity, is displayed on the display portion. In addition, when conveying a commodity 3260 by a belt conveyor, the inspection of the commodity 3260 can be carried out by utilizing a reader/writer 3240 and an RFID 3250 provided on the commodity 3260 (FIG. 17C). In this way, by utilizing an RFID for a system, information can be easily obtained, thereby realizing high performance and high added value.

Moreover, the present embodiment mode can be implemented by being freely combined with the above mentioned embodiment modes.

Embodiment Mode 7

A semiconductor device 20 of the present invention can be widely used in various fields since it can clarify a history and the like of an object without contact. The semiconductor device of the present invention can be applied to any products so long as they are useful for production and management. For example, semiconductor devices of the present invention can be provided to bills, coins, portfolios, bonds, bearer bonds, wrapping containers, documents, recording mediums, personal belongings, vehicles, foods, clothes, health goods, livingwares, chemicals, electric appliances, and the like. Examples thereof will be described with reference to FIGS. 18A to 18H.

Bills and coins indicate money circulating in the market, and include a thing valid in a certain area as currency (cash vouchers), memorial coins, and the like. Portfolios indicate checks, certificates, promissory notes, and the like (see FIG. 18A). Certificates indicate driver's licenses, certificates of residence, and the like (see FIG. 18B). Bearer bonds indicate stamps, rice coupons, various merchandise coupons, and the like (see FIG. 18C). Packing containers indicate wrapping papers for lunch boxes and the like, plastic bottles, and the like (see FIG. 18D). Documents indicate books, and the like (see FIG. 18E). Recording mediums indicate DVD software, video tapes, and the like (see FIG. 18F). Vehicles indicate wheeled vehicles such as bicycles, ships, and the like (see FIG. 18G). Personal belongings indicate bags, eye glasses, and the like (see FIG. 18H). Foods indicate food goods, drinks, and the like. Clothing indicates clothes, footwear, and the like. Health goods indicate medical appliances, health appliances, and the like. Livingware indicates furniture, lighting equipment, and the like. Chemicals indicate medical products, agrochemicals, and the like. Electric appliances indicate liquid crystal display devices, EL display devices, television devices (TV sets or flat-screen televisions), mobile phones, and the like.

By providing RFIDs to such things as bills, coins, portfolios, certificates, bears bonds, counterfeits can be prevented. Further, efficiencies for an inspection system or a system used in a rental shop can be improved by providing RFIDs to packing containers, documents, recording mediums, personal belongings, foods, livingware, electric appliances, and the like. By providing RFIDs to vehicles, health goods, chemicals, and the like, counterfeits and theft can be prevented. In the case of a medicine, it can be possible to prevent it from being taken by mistake. An RFID is provided to the foregoing items by sticking it to their surfaces or embedding it therein. For example, in the case of a book, an RFID may be embedded in a page or embedded in an organic resin when a packaging is made from organic resin. When data is written in (added to) an RFID by applying an optical action, a film provided over a memory element is preferably formed using a transparent material such that the memory element in the RFID can be irradiated with light. Furthermore, by using a memory element to which data, which had been written once, is non-rewritable, counterfeits of data can be prevented efficiently. In addition, the matters of privacy and the like after a user purchased a good can be overcome by providing a system for erasing data of a memory element provided in an RFID.

By providing the RFIDs to wrapping containers, recording mediums, personal belongings, foods, clothes, livingwares, electric appliances, and the like, in this manner, an inspection system, a system of a rental shop can be improved efficiently. Additionally, by providing the RFIDs to vehicles, the counterfeits and the theft can be prevented. By embedding the RFIDs in creatures such as animals, individual creatures can be identified easily. For example, by embedding an RFID in a creature such as livestock, a birth data, sexuality, breed, and the like can be easily identified and a health condition such as a body temperature, and the like can be easily managed.

As set forth above, the semiconductor devices according to the present invention can be provided to various kinds of goods. Moreover, the present embodiment mode can be implemented by being freely combined with the above embodiment modes.

The present application is based on Japanese Patent Application serial No. 2005-022191 filed on Jan. 28, 2005 in Japanese Patent Office, the entire contents of which are hereby incorporated by reference.

DESCRIPTION OF REFERENCE NUMERALS

20: semiconductor device, 100: substrate, 101: element formation layer, 102: conductive film, 103: first insulating film, 104: second insulating film, 105: third insulating film, 106: fourth insulating film, 107: transistor, 140: groove, 145: nozzle, 146: composition, 147: conductive body, 111: element formation layer, 112a and 112b: conductive film, 200: substrate, 201-203: insulating film, 204: semiconductor film, 205: thin film transistor, 206 and 207: insulating film, 208: conductive film, 209 and 210: insulating film, 211 and 212: conductive film, 213: insulating film, 214: opening, 215: etching agent, 216 and 217: substrate, 218: groove, 219: element formation layer, 304: conductive film, 305: resin, 306: conductive microparticle, 307: connection region, 310: substrate, 311: insulating film, 312: conductive film, 313: insulating film, 314: opening, 315: groove, 316: conductive film, 317: antenna formation layer, 318: wiring, 320: substrate, 321: insulating film, 322: separation layer, 323 and 324: insulating film, 325: conductive film, 326: insulating film, 327: opening, 328: substrate, 329: opening, 330: antenna formation layer, 335: wiring, 701: substrate, 702: separation layer, 703: insulating film, 704: amorphous semiconductor film, 705: insulating film, 706-710: crystalline semiconductor film, 711: N-type impurity region, 712: P-type impurity region, 713-715: N-type impurity region, 716-725: conductive film, 726-733: N-type impurity region, 734-743: insulating film, 744-748: thin film transistor, 749-751: insulating film, 752-761: conductive film, 762: insulating film, 763-765: conductive film, 766: insulating film, 767-769: contact hole, 771: conductive film, 772: insulating film, 773 and 774: opening, 780-784: channel formation region, 875: P-type impurity region, 786: conductive film, 787: organic compound layer, 789 and 790: memory element portion, 791: element layer, 775: first sheet material, 776: second sheet material, 777: third sheet material, 81: power supply circuit, 82: clock generation circuit, 83 and 84: data demodulation circuit, 85: control circuit, 86: memory circuit, 87: antenna, 88: reader/writer, 3210: display portion, 3200: reader/writer, 3220: product, 3230: RFID, 3240: reader/writer, 3250: RFID, 3260: commodity

The invention claimed is:

1. A semiconductor device comprising:
a transistor provided over a substrate;
an insulating film provided over the transistor, wherein a groove is provided in the insulating film;
a conductive film electrically connected to the transistor; and
a protection film provided over the conductive film,
wherein the groove has a coiled shape,
wherein the conductive film is provided over at least the groove of the insulating film so that a surface of the conductive film facing the protection film forms a plurality of concave cross-sectional shapes, and
wherein the conductive film is in contact with the insulating film at a bottom of the groove.

2. A semiconductor device comprising:
a transistor provided over a substrate;
a first insulating film provided over the transistor;
a second insulating film provided over the first insulating film, wherein a groove is provided in the second insulating film so as to expose the first insulating film;
a conductive film in contact with the first insulating film at a bottom of the groove, and electrically connected to the transistor; and
a protection film provided over the conductive film,
wherein the groove has a coiled shape, and
wherein the conductive film is provided over the groove and a portion of the second insulating film so that a surface of the conductive film facing the protection film forms a plurality of concave cross-sectional shapes.

3. A semiconductor device comprising:
an element formation layer comprising a transistor provided over a substrate; and
an antenna formation layer comprising an insulating film and a conductive film,
wherein a groove is provided in the insulating film,
wherein the groove has a coiled shape,
wherein the conductive film is provided over at least the groove of the insulating film, wherein a lower and an upper surface of the conductive film are configured to form a plurality of concave cross-sectional shapes, wherein the element formation layer and the antenna formation layer are attached to each other, wherein the transistor and the conductive film are electrically connected to each other, and wherein the conductive film is in contact with the insulating film at a bottom of the groove.

4. The semiconductor device according to claim 3, wherein the element formation layer and the antenna formation layer are attached to each other with an adhesive agent.

5. A semiconductor device comprising:

a transistor provided over a substrate;

an insulating film provided over the transistor, wherein a groove is provided in the insulating film; and a conductive film electrically connected to the transistor, wherein the groove has a coiled shape, wherein the conductive film is provided over the groove and a portion of the insulating film, wherein a lower and an upper surface of the conductive film are configured to form a plurality of concave cross-sectional shapes, wherein a thickness of the conductive film provided over the groove is different from that provided over the portion of the insulating film, and wherein the conductive film is in contact with the insulating film at a bottom of the groove.

6. The semiconductor device according to any one of claims 1 to 5, wherein the conductive film has a coiled shape.

7. The semiconductor device according to any one of claims 1 to 5, wherein the substrate has a flexibility.

8. The semiconductor device according to any one of claims 1 to 5, wherein the semiconductor device comprises an IC chip.

9. The semiconductor device according to any one of claims 1, 3, and 5, wherein the groove is formed in parallel to an outer edge of the insulating film and has a plurality of square corners so as to bend the groove from an outer portion to an inner portion.

10. The semiconductor device according to any one of claims 1, 3, and 5, wherein a bottom surface of the conductive film is in contact with the insulating film.

11. The semiconductor device according to any one of claims 1 to 5, wherein the conductive film has a curved cross section.

12. A method for manufacturing a semiconductor device comprising:

forming an element formation layer comprising a transistor over a substrate;

forming an insulating film over the element formation layer;

forming a groove, which has a coiled shape, in the insulating film by selectively removing the insulating film;

forming a conductive film over the insulating film and the groove so that a lower and an upper surface of the conductive film are configured to form a plurality of concave cross-sectional shapes and the conductive film is in contact with the insulating film at a bottom of the groove;

forming a pattern of the conductive film by selectively removing a part of the conductive film; and forming a protection film to cover the pattern of the conductive film.

13. A method for manufacturing a semiconductor device comprising:

forming a separation layer over a substrate;

forming an element formation layer comprising a transistor over the separation layer;

forming an insulating film over the element formation layer;

forming a groove, which has a coiled shape, in the insulating film by selectively removing the insulating film;

forming a conductive film over the insulating film and the groove so that a lower and an upper surface of the conductive film are configured to form a plurality of concave cross-sectional shapes and the conductive film is in contact with the insulating film at a bottom of the groove;

forming a pattern of the conductive film by selectively removing a part of the conductive film;

forming a protection film to cover the pattern of the conductive film;

forming an opening by selectively removing the protection film, the insulating film and the element formation layer to expose the separation layer through the opening; and separating the element formation layer from the substrate.

14. A method for manufacturing a semiconductor device comprising:

forming a separation layer over a first substrate;

forming an element formation layer comprising a transistor over the separation layer;

forming an insulating film over the element formation layer;

forming a groove, which has a coiled shape, in the insulating film by selectively removing the insulating film;

forming a conductive film over the insulating film and the groove so that a lower and an upper surface of the conductive film are configured to form a plurality of concave cross-sectional shapes and the conductive film is in contact with the insulating film at a bottom of the groove;

forming a pattern of the conductive film by selectively removing a part of the conductive film;

forming a protection film to cover the pattern of the conductive film;

forming an opening by selectively removing the protection film, the insulating film and the element formation layer to expose the separation layer through the opening;

attaching a second substrate to a surface of the protection film; and separating the element formation layer from the first substrate.

15. The method for manufacturing a semiconductor device according to claim 14, wherein the separating step is conducted by a physical means.

16. The method for manufacturing a semiconductor device according to claim 14, wherein the second substrate has a flexibility.

17. The method for manufacturing a semiconductor device according to any one of claims 12 to 14, wherein the pattern of the conductive film has a coiled shape.

18. The method for manufacturing a semiconductor device according to any one of claims 12 to 14, wherein the insulating film is formed by using a screen printing.

19. The method for manufacturing a semiconductor device according to any one of claims 12 to 14, wherein the protection film contains an organic resin.

20. The method for manufacturing a semiconductor device according to any one of claims 12 to 14, wherein the semiconductor device comprises an IC chip.

21. The method for manufacturing a semiconductor device according to any one of claims 12 to 14, wherein the groove is formed in parallel to an outer edge of the insulating film and has a plurality of square corners so as to bend the groove from an outer portion to an inner portion.

22. The method for manufacturing a semiconductor device according to any one of claims 12 to 14, wherein a bottom surface of the conductive film is in contact with the insulating film.

* * * * *